(12) United States Patent
Nakao et al.

(10) Patent No.: US 6,922,803 B2
(45) Date of Patent: Jul. 26, 2005

(54) TEST METHOD OF SEMICONDUCTOR INTERGRATED CIRCUIT AND TEST PATTERN GENERATOR

(75) Inventors: Michinobu Nakao, Hachiouji (JP); Kazumi Hatayama, Hachiouji (JP); Koichiro Natsume, Kokubunji (JP); Yoshikazu Kiyoshige, Hachiouji (JP); Masaki Kouno, Ome (JP); Masato Hamamoto, Iruma (JP); Hidefumi Yoshida, Ome (JP); Tomoji Nakamura, Fussa (JP)

(73) Assignees: Hitachi, Ltd., Tokyo (JP); Hitachi Information Technology Co., Ltd., Kanagawa (JP)

(*) Notice: Subject to any disclaimer, the term of this patent is extended or adjusted under 35 U.S.C. 154(b) by 615 days.

(21) Appl. No.: 09/811,435

(22) Filed: Mar. 20, 2001

(65) Prior Publication Data

US 2002/0073373 A1 Jun. 13, 2002

(30) Foreign Application Priority Data

Dec. 13, 2000 (JP) .................................... 2000-378423

(51) Int. Cl.[7] .............................................. G06F 11/00
(52) U.S. Cl. ................................................... 714/738
(58) Field of Search ............................. 714/738, 739, 714/733, 734, 726

(56) References Cited

U.S. PATENT DOCUMENTS

| | | | | |
|---|---|---|---|---|
| 5,258,985 A | * | 11/1993 | Spence et al. | 714/732 |
| 5,636,225 A | * | 6/1997 | Osawa | 714/718 |
| 5,682,388 A | * | 10/1997 | Reeves | 714/703 |
| 6,327,687 B1 | * | 12/2001 | Rajski et al. | 714/738 |
| 6,578,180 B2 | * | 6/2003 | Tanner | 716/4 |
| 6,615,380 B1 | * | 9/2003 | Kapur et al. | 714/738 |

FOREIGN PATENT DOCUMENTS

| | | | |
|---|---|---|---|
| JP | 10197601 | * | 8/1998 |
| JP | 11142481 A | * | 3/1999 |

OTHER PUBLICATIONS

Tsai et al., "STARBIST: Scan Autocorrelated Random Pattern Generation", Department of Electrical & Computer Enginerring, University of CA, pp. 472–477.*
Hellebrand et al., "Generation of Vector Patterns Through Reseeding of Multiple–Polynomial Linear Feedback Shift Registers", International test Conference 1992, paper 5.2, pp. 120–129.*
Kiefer et al., "Deterministic BIST with Multiple Scan Chains", Computer Auchitecture Lab, University of Stuttgart, pp. 1057–1064.a.*

* cited by examiner

*Primary Examiner*—Christine T. Tu
(74) *Attorney, Agent, or Firm*—Antonelli, Terry, Stout & Kraus, LLP

(57) ABSTRACT

A semiconductor integrated circuit test method which reduces the required data volume for testing and efficiently detects faults in a circuit to be tested, the method comprising means 110 to generate identical pattern sequences repeatedly and means 120 to control flipped bits in pattern sequences, in order to generate neighborhood pattern sequences and use the neighborhood patterns to test the circuit under test 130. The neighborhood patterns include, in whole or in part, such pattern sequences as ones without flipped bits, ones with all or some flipped bits in one pattern and ones with all or some flipped bits in consecutive patterns or patterns at regular intervals, the interval being equivalent to a given number of patterns. Because a test pattern generator is provided independently of the circuit to be tested, the problem of a prolonged design period can be eliminated, a loss in the operating speed of the circuit under test is minimized and a high fault coverage can be achieved with less hardware overhead and a smaller volume of test data.

12 Claims, 32 Drawing Sheets

FIG. 9(a)

| MODE | INTSEL | BRC | REGISTER |
|---|---|---|---|
| INITIALIZATION | 1 | ⤒ | SHIFT |
| PATTERN GENERATION | 0 | ⤒ | RANDOM |

FIG. 9(b)

| MODE | INTSEL | RDSEL | BRC | REGISTER | SEED BACKUP REGISTER |
|---|---|---|---|---|---|
| INITIALIZATION | 1 | 0 | ⤒ | SHIFT | SEED COPY |
| PATTERN GENERATION | 0 | 0 | ⤒ | RANDOM | HOLD |
| SEED RECOVERY | 0 | 1 | ⤒ | RECOVERY | HOLD |
| SEED UPDATE | 1 | 0 | — | — | SEED COPY |

FIG. 9(c)

| MODE | INTSEL | RDSEL | BRC | REGISTER | SEED BACKUP REGISTER |
|---|---|---|---|---|---|
| INITIALIZATION | 1 | 0 | ⤒ | SHIFT | SEED COPY |
| PATTERN GENERATION | 0 | 0 | ⤒ | RANDOM | HOLD |
| SEED RECOVERY | — | 1 | ⤒ | RECOVERY | HOLD |

| | MODE | BINIT | NHGEN | INTSEL | RDSEL | NBEN | HCCKEN |
|---|---|---|---|---|---|---|---|
| 841 | INITIALIZATION | 1 | 0 | 1 | 0 | 0 | 1 |
| 842 | PATTERN GENERATION | 0 | 0 | 0 | 0 | 0 | 0 |
| 843 | SEED RECOVERY | 0 | 1 | 0 | 1 | 0 | 1 |
| 844 | NEIGHBORHOOD PATTERN GENERATION | 1 | 1 | 0 | 0 | 1 | 0 |

| PATTERN NUMBER | TEST PATTERN | | | | | | | | | DETECTABLE STUCK-AT FAULT (SIGNAL LINE NAME/STUCK VALUE) |
|---|---|---|---|---|---|---|---|---|---|---|
| | x1 | x2 | x3 | x4 | x5 | x6 | x7 | x8 | x0 | |
| 1 | 1 | 1 | 1 | 1 | 1 | 1 | 1 | 1 | X | x0/0 x1/0 x2/0 x3/0 x4/0 x5/0 x6/0 x7/0 x8/0 |
| 2 | 0 | 1 | 1 | 1 | 1 | 1 | 1 | 1 | X | x0/1 x1/1 |
| 3 | 1 | 0 | 1 | 1 | 1 | 1 | 1 | 1 | X | x0/1 x2/1 |
| 4 | 1 | 1 | 0 | 1 | 1 | 1 | 1 | 1 | X | x0/1 x3/1 |
| 5 | 1 | 1 | 1 | 0 | 1 | 1 | 1 | 1 | X | x0/1 x4/1 |
| 6 | 1 | 1 | 1 | 1 | 0 | 1 | 1 | 1 | X | x0/1 x5/1 |
| 7 | 1 | 1 | 1 | 1 | 1 | 0 | 1 | 1 | X | x0/1 x6/1 |
| 8 | 1 | 1 | 1 | 1 | 1 | 1 | 0 | 1 | X | x0/1 x7/1 |
| 9 | 1 | 1 | 1 | 1 | 1 | 1 | 1 | 0 | X | x0/1 x8/1 |
| 10 | X | X | X | X | X | X | X | X | 1 | y0/0 |
| 11 | X | X | X | X | X | X | X | X | 0 | y0/1 |

FIG. 29

| TIME | MODE | BI NIT | NH GEN | BRC | SEN | CLK | TDI | FBI EN | PG1 | PG2 | PG3 | PG4 | LC1 | LC2 | LC3 | HC1 | HC2 | HC3 |
|---|---|---|---|---|---|---|---|---|---|---|---|---|---|---|---|---|---|---|
| 0 | INITIALIZATION | 0 | 0 | 0 | 1 | 0 | 1 | X | X | X | X | X | X | X | X | X | X | X |
| 1 |  | 1 | 0 | P | 1 | 0 | 1 | 1 | X | X | X | X | X | X | X | X | X | X |
| 2 |  | 1 | 0 | P | 1 | 0 | 1 | 1 | 1 | X | X | X | X | X | X | X | X | X |
| 3 |  | 1 | 0 | P | 1 | 0 | 0 | 1 | 1 | 1 | X | X | X | X | X | X | X | X |
| 4 |  | 1 | 0 | P | 1 | 0 | 0 | 0 | 1 | 1 | 1 | X | X | X | X | X | X | X |
| 5 |  | 1 | 0 | P | 1 | 0 | 0 | 0 | 0 | 1 | 1 | 1 | X | X | X | X | X | X |
| 6 |  | 1 | 0 | P | 1 | 0 | 1 | 0 | 0 | 0 | 1 | 1 | 1 | X | X | X | X | X |
| 7 |  | 1 | 0 | P | 1 | 0 | 1 | 1 | 0 | 0 | 0 | 1 | 1 | 1 | X | X | X | X |
| 8 |  | 1 | 0 | P | 1 | 0 | 0 | 1 | 1 | 0 | 0 | 0 | 1 | 1 | 1 | X | X | X |
| 9 |  | 1 | 0 | P | 1 | 0 | 1 | 1 | 1 | 1 | 0 | 0 | 0 | 1 | 1 | 1 | X | X |
| 10 |  | 1 | 0 | P | 1 | 0 | 0 | 1 | 1 | 1 | 1 | 0 | 0 | 0 | 1 | 1 | 1 | X |
| 11 |  | 1 | 0 | P | 1 | 0 | X | 0 | 1 | 1 | 1 | 1 | 0 | 0 | 0 | 1 | 1 | 1 |
| 12 | PARENT PATTERN SETTING | 0 | 0 | P | 1 | P | X | 0 | 1 | 1 | 1 | 1 | 1 | 0 | 0 | 1 | 1 | 1 |
| 13 |  | 0 | 0 | P | 1 | P | X | 0 | 1 | 1 | 1 | 1 | 0 | 1 | 0 | 1 | 1 | 1 |
| 14 |  | 0 | 0 | P | 1 | P | X | 0 | 1 | 1 | 1 | 1 | 1 | 1 | 0 | 1 | 1 | 1 |
| 15 |  | 0 | 0 | P | 1 | P | X | 0 | 1 | 1 | 1 | 1 | 0 | 0 | 1 | 1 | 1 | 1 |
| 16 |  | 0 | 0 | P | 1 | P | X | 0 | 1 | 1 | 1 | 1 | 1 | 0 | 1 | 1 | 1 | 1 |
| 17 |  | 0 | 0 | P | 1 | P | X | 0 | 1 | 1 | 1 | 1 | 0 | 1 | 1 | 1 | 1 | 1 |
| 18 |  | 0 | 0 | P | 1 | P | X | 0 | 1 | 1 | 1 | 1 | 1 | 1 | 1 | 1 | 1 | 1 |
| 19 |  | 0 | 0 | P | 1 | P | X | 0 | 1 | 1 | 1 | 1 | 0 | 0 | 0 | 1 | 1 | 1 |
| 20 | CLOCK ADVANCE | 0 | 1 | P | 0 | P | X | 0 | 1 | 1 | 1 | 1 | 0 | 0 | 0 | 0 | 0 | 0 |
| 21 | CHILD PATTERN 0 SETTING (RESULT OF PARENT PATTERN) | 1 | 1 | P | 1 | P | X | 0 | 1 | 1 | 1 | 1 | 1 | 0 | 0 | 0 | 0 | 0 |
| 22 |  | 1 | 1 | P | 1 | P | X | 0 | 1 | 1 | 1 | 1 | 0 | 1 | 0 | 0 | 0 | 0 |
| 23 |  | 1 | 1 | P | 1 | P | X | 0 | 1 | 1 | 1 | 1 | 1 | 1 | 0 | 0 | 0 | 0 |
| 24 |  | 1 | 1 | P | 1 | P | X | 0 | 1 | 1 | 1 | 1 | 0 | 0 | 1 | 0 | 0 | 0 |
| 25 |  | 1 | 1 | P | 1 | P | X | 0 | 1 | 1 | 1 | 1 | 1 | 0 | 1 | 0 | 0 | 0 |
| 26 |  | 1 | 1 | P | 1 | P | X | 0 | 1 | 1 | 1 | 1 | 0 | 1 | 1 | 0 | 0 | 0 |
| 27 |  | 1 | 1 | P | 1 | P | X | 0 | 1 | 1 | 1 | 1 | 1 | 1 | 1 | 0 | 0 | 0 |
| 28 |  | 1 | 1 | P | 1 | P | X | 0 | 1 | 1 | 1 | 1 | 0 | 0 | 0 | 0 | 0 | 0 |
| 29 | CLOCK ADVANCE | 0 | 1 | P | 1 | P | X | 0 | 1 | 1 | 1 | 1 | 0 | 0 | 0 | 1 | 0 | 0 |
| 30 | CHILD PATTERN 1 SETTING (RESULT OF CHILD PATTERN 0) | 1 | 1 | P | 1 | P | X | 0 | 1 | 1 | 1 | 1 | 1 | 0 | 0 | 1 | 0 | 0 |
| 31 |  | 1 | 1 | P | 1 | P | X | 0 | 1 | 1 | 1 | 1 | 0 | 1 | 0 | 1 | 0 | 0 |
| 32 |  | 1 | 1 | P | 1 | P | X | 0 | 1 | 1 | 1 | 1 | 1 | 1 | 0 | 1 | 0 | 0 |
| 33 |  | 1 | 1 | P | 1 | P | X | 0 | 1 | 1 | 1 | 1 | 0 | 0 | 1 | 1 | 0 | 0 |
| 34 |  | 1 | 1 | P | 1 | P | X | 0 | 1 | 1 | 1 | 1 | 1 | 0 | 1 | 1 | 0 | 0 |
| 35 |  | 1 | 1 | P | 1 | P | X | 0 | 1 | 1 | 1 | 1 | 0 | 1 | 1 | 1 | 0 | 0 |
| 36 |  | 1 | 1 | P | 1 | P | X | 0 | 1 | 1 | 1 | 1 | 1 | 1 | 1 | 1 | 0 | 0 |
| 37 |  | 1 | 1 | P | 1 | P | X | 0 | 1 | 1 | 1 | 1 | 0 | 0 | 0 | 1 | 0 | 0 |
| 38 | CLOCK ADVANCE | 0 | 1 | P | 1 | P | X | 0 | 1 | 1 | 1 | 1 | 0 | 0 | 0 | 0 | 1 | 0 |
| 83 | CLOCK ADVANCE | 0 | 1 | P | 1 | P | X | 0 | 1 | 1 | 1 | 1 | 0 | 0 | 0 | 1 | 1 | 1 |
| 84 | CHILD PATTERN 7 SETTING (RESULT OF CHILD PATTERN 6) | 1 | 1 | P | 1 | P | X | 0 | 1 | 1 | 1 | 1 | 1 | 0 | 0 | 1 | 1 | 1 |
| 85 |  | 1 | 1 | P | 1 | P | X | 0 | 1 | 1 | 1 | 1 | 0 | 1 | 0 | 1 | 1 | 1 |
| 86 |  | 1 | 1 | P | 1 | P | X | 0 | 1 | 1 | 1 | 1 | 1 | 1 | 0 | 1 | 1 | 1 |
| 87 |  | 1 | 1 | P | 1 | P | X | 0 | 1 | 1 | 1 | 1 | 0 | 0 | 1 | 1 | 1 | 1 |
| 88 |  | 1 | 1 | P | 1 | P | X | 0 | 1 | 1 | 1 | 1 | 1 | 0 | 1 | 1 | 1 | 1 |
| 89 |  | 1 | 1 | P | 1 | P | X | 0 | 1 | 1 | 1 | 1 | 0 | 1 | 1 | 1 | 1 | 1 |
| 90 |  | 1 | 1 | P | 1 | P | X | 0 | 1 | 1 | 1 | 1 | 1 | 1 | 1 | 1 | 1 | 1 |
| 91 |  | 1 | 1 | P | 1 | P | X | 0 | 1 | 1 | 1 | 1 | 0 | 0 | 0 | 1 | 1 | 1 |
| 92 | CLOCK ADVANCE | 0 | 1 | P | 1 | P | X | 0 | 1 | 1 | 1 | 1 | 0 | 0 | 0 | 0 | 0 | 0 |
| 93 | RESULT OF CHILD PATTERN | 1 | 1 | P | 1 | P | X | 0 | 1 | 1 | 1 | 1 | 1 | 0 | 0 | 0 | 0 | 0 |
| 94 |  | 1 | 1 | P | 1 | P | X | 0 | 1 | 1 | 1 | 1 | 0 | 1 | 0 | 0 | 0 | 0 |
| 95 |  | 1 | 1 | P | 1 | P | X | 0 | 1 | 1 | 1 | 1 | 1 | 1 | 0 | 0 | 0 | 0 |
| 96 |  | 1 | 1 | P | 1 | P | X | 0 | 1 | 1 | 1 | 1 | 0 | 0 | 1 | 0 | 0 | 0 |
| 97 |  | 1 | 1 | P | 1 | P | X | 0 | 1 | 1 | 1 | 1 | 1 | 0 | 1 | 0 | 0 | 0 |
| 98 |  | 1 | 1 | P | 1 | P | X | 0 | 1 | 1 | 1 | 1 | 0 | 1 | 1 | 0 | 0 | 0 |
| 99 |  | 1 | 1 | P | 1 | P | X | 0 | 1 | 1 | 1 | 1 | 1 | 1 | 1 | 0 | 0 | 0 |
| 100 |  | 1 | 1 | P | 1 | P | X | 0 | 1 | 1 | 1 | 1 | 1 | 1 | 1 | 0 | 0 | 0 |

FIG. 30

| TIME | MODE | y0 | x1 | x2 | x3 | x4 | x5 | x6 | x7 | x8 | o1 | o2 |
|---|---|---|---|---|---|---|---|---|---|---|---|---|
| 0 | INITIALIZATION | X | X | X | X | X | X | X | X | X | X | X |
| 1 |  | X | X | X | X | X | X | X | X | X | X | X |
| 2 |  | X | X | X | X | X | X | X | X | X | X | X |
| 3 |  | X | X | X | X | X | X | X | X | X | X | X |
| 4 |  | X | X | X | X | X | X | X | X | X | X | X |
| 5 |  | X | X | X | X | X | X | X | X | X | X | X |
| 6 |  | X | X | X | X | X | X | X | X | X | X | X |
| 7 |  | X | X | X | X | X | X | X | X | X | X | X |
| 8 |  | X | X | X | X | X | X | X | X | X | X | X |
| 9 |  | X | X | X | X | X | X | X | X | X | X | X |
| 10 |  | X | X | X | X | X | X | X | X | X | X | X |
| 11 |  | X | X | X | X | X | X | X | X | X | X | X |
| 12 | PARENT PATTERN SETTING | 1 | 1 | X | X | X | X | X | X | X | X | X |
| 13 |  | 1 | 1 | 1 | X | X | X | X | X | X | 1 | X |
| 14 |  | 1 | 1 | 1 | 1 | X | X | X | X | X | 1 | X |
| 15 |  | 1 | 1 | 1 | 1 | 1 | X | X | X | X | 1 | X |
| 16 |  | 1 | 1 | 1 | 1 | 1 | 1 | X | X | X | 1 | X |
| 17 |  | 1 | 1 | 1 | 1 | 1 | 1 | 1 | X | X | 1 | X |
| 18 |  | 1 | 1 | 1 | 1 | 1 | 1 | 1 | 1 | X | 1 | X |
| 19 |  | 1 | 1 | 1 | 1 | 1 | 1 | 1 | 1 | 1 | 1 | X |
| 20 | CLOCK ADVANCE | 1 | 1 | 1 | 1 | 1 | 1 | 1 | 1 | 1 | 1 | X |
| 21 | CHILD PATTERN 0 SETTING (RESULT OF PARENT PATTERN) | 0 | 0 | 1 | 1 | 1 | 1 | 1 | 1 | 1 | 1 | 1 |
| 22 |  | 1 | 1 | 0 | 1 | 1 | 1 | 1 | 1 | 1 | 0 | 1 |
| 23 |  | 1 | 1 | 1 | 0 | 1 | 1 | 1 | 1 | 1 | 1 | 1 |
| 24 |  | 1 | 1 | 1 | 1 | 0 | 1 | 1 | 1 | 1 | 1 | 1 |
| 25 |  | 1 | 1 | 1 | 1 | 1 | 0 | 1 | 1 | 1 | 1 | 1 |
| 26 |  | 1 | 1 | 1 | 1 | 1 | 1 | 0 | 1 | 1 | 1 | 1 |
| 27 |  | 1 | 1 | 1 | 1 | 1 | 1 | 1 | 0 | 1 | 1 | 1 |
| 28 |  | 1 | 1 | 1 | 1 | 1 | 1 | 1 | 1 | 0 | 1 | 1 |
| 29 | CLOCK ADVANCE | 0 | 1 | 1 | 1 | 1 | 1 | 1 | 1 | 1 | 1 | 1 |
| 30 | CHILD PATTERN 1 SETTING (RESULT OF CHILD PATTERN 0) | 1 | 1 | 1 | 1 | 1 | 1 | 1 | 1 | 1 | 0 | 1 |
| 31 |  | 0 | 0 | 1 | 1 | 1 | 1 | 1 | 1 | 1 | 1 | 1 |
| 32 |  | 1 | 1 | 0 | 1 | 1 | 1 | 1 | 1 | 1 | 1 | 1 |
| 33 |  | 1 | 1 | 1 | 0 | 1 | 1 | 1 | 1 | 1 | 1 | 1 |
| 34 |  | 1 | 1 | 1 | 1 | 0 | 1 | 1 | 1 | 1 | 1 | 1 |
| 35 |  | 1 | 1 | 1 | 1 | 1 | 0 | 1 | 1 | 1 | 1 | 1 |
| 36 |  | 1 | 1 | 1 | 1 | 1 | 1 | 0 | 1 | 1 | 1 | 1 |
| 37 |  | 1 | 1 | 1 | 1 | 1 | 1 | 1 | 0 | 1 | 1 | 1 |
| 38 | CLOCK ADVANCE | 0 | 1 | 1 | 1 | 1 | 1 | 1 | 1 | 1 | 1 | 1 |
| 83 | CLOCK ADVANCE | 0 | 1 | 1 | 1 | 1 | 1 | 1 | 1 | 1 | 1 | 1 |
| 84 | CHILD PATTERN 7 SETTING (RESULT OF CHILD PATTERN 6) | 1 | 1 | 1 | 1 | 1 | 1 | 1 | 1 | 1 | 0 | 1 |
| 85 |  | 1 | 1 | 1 | 1 | 1 | 1 | 1 | 1 | 1 | 1 | 1 |
| 86 |  | 1 | 1 | 1 | 1 | 1 | 1 | 1 | 1 | 1 | 1 | 1 |
| 87 |  | 1 | 1 | 1 | 1 | 1 | 1 | 1 | 1 | 1 | 1 | 1 |
| 88 |  | 1 | 1 | 1 | 1 | 1 | 1 | 1 | 1 | 1 | 1 | 1 |
| 89 |  | 1 | 1 | 1 | 1 | 1 | 1 | 1 | 1 | 1 | 1 | 1 |
| 90 |  | 1 | 1 | 1 | 1 | 1 | 1 | 1 | 1 | 1 | 1 | 1 |
| 91 |  | 0 | 0 | 1 | 1 | 1 | 1 | 1 | 1 | 1 | 1 | 1 |
| 92 | CLOCK ADVANCE | 0 | 0 | 0 | 0 | 0 | 0 | 0 | 0 | 0 | 1 | 1 |
| 93 | RESULT OF CHILD PATTERN | 0 | 0 | 0 | 0 | 0 | 0 | 0 | 0 | 0 | 0 | 0 |
| 94 |  | 1 | 1 | 0 | 0 | 0 | 0 | 0 | 0 | 0 | 1 | 0 |
| 95 |  | 1 | 1 | 1 | 0 | 0 | 0 | 0 | 0 | 0 | 1 | 0 |
| 96 |  | 1 | 1 | 1 | 1 | 0 | 0 | 0 | 0 | 0 | 1 | 0 |
| 97 |  | 1 | 1 | 1 | 1 | 1 | 0 | 0 | 0 | 0 | 1 | 0 |
| 98 |  | 1 | 1 | 1 | 1 | 1 | 1 | 0 | 0 | 0 | 1 | 0 |
| 99 |  | 1 | 1 | 1 | 1 | 1 | 1 | 1 | 0 | 0 | 1 | 0 |
| 100 |  | 1 | 1 | 1 | 1 | 1 | 1 | 1 | 1 | 0 | 1 | 0 |

TEST METHOD OF SEMICONDUCTOR INTERGRATED CIRCUIT AND TEST PATTERN GENERATOR

FIELD OF THE INVENTION

This invention relates to a semiconductor integrated circuit test method, and a test pattern generator and semiconductor integrated circuit which are used in the test method.

BACKGROUND OF THE INVENTION

Typical test methods for checking whether a semiconductor integrated circuit is acceptable or not are a stored test method and a built-in self-test method (BIST). In the stored test method, a test pattern for an assumed fault is obtained according to an algorithm and applied to the circuit to be tested through a test device which stores the pattern for comparison of response pattern from the circuit with an expected pattern. In the BIST method, the semiconductor integrated circuit incorporates a pseudo-random pattern generator and a signature analyzer to give a huge volume of pseudo-random patterns to the circuit to be tested and compare the compacted result of response pattern with an expected pattern.

The stored test method has the following problem: in order to achieve a high fault coverage for a large-scale circuit to be tested, the required number of test patterns or the required volume of test data is too large for the semiconductor integrated circuit test device to store such patterns or data. The problem of the BIST method is that, since pseudo-random patterns generated by a linear feedback shift register (LFSR) are used, the required volume of test data is relatively small but a high fault coverage cannot be guaranteed when a limited number of pseudo-random patterns are used for a large-scale circuit.

Many proposals for improvement in the fault coverage by the BIST method have been made. In the test point insertion methods disclosed in J-P-A-No. 197601/1998 and J-P-A-No. 142481/1999, a circuit called a test point is added to the circuit under test to achieve a high fault coverage even with random patterns. According to the procedure described in a paper by K. H. Tsai et al, entitled "STARBIST: Scan Autocorrelated Random Pattern Generation" (literature: Proceeding of Design Automation Conference '97. 1997, pp. 472–477), in order to generate neighborhood patterns each of which has one bit flipped with respect to a reference pattern with a specific probability, a circuit which controls the weight of random patterns generated by an LFSR and a circuit which controls bit-flipping are added midway in a scan chain for efficient fault detection. According to the method described in a paper by G. Kiefer et al, "Deterministic BIST with Multiple Scan Chains" (literature: Proceeding of International Test Conference '98. 1998 pp. 1057–1064), a logic for flipping some bits is added in order to transform pseudo-random patterns generated by an LFSR into similar test patterns. In the Reseeding technique stated in a paper by S. Hellebrand, "Generation of vector patterns through reseeding of multiple-polynomial linear feedback shift registers" (literature: Proceeding of International Test Conference '92. 1992, pp. 120–129), LFSR's initial value (called "seed") is calculated from a test pattern to be generated and the seed is replaced one after another.

All the above-mentioned BIST-based methods for fault coverage improvement have problems to be solved when they are applied to large-scale semiconductor integrated circuits. The test point insertion method has the following two problems: one is that the circuit operating speed is slowed because a test point is inserted into the path in the semiconductor integrated circuit to be tested (hereinafter called a "circuit under test" or "CUT") and the other is that, since the test point should depend on the CUT, the layout and wiring pattern of the CUT cannot be determined even locally until where to insert the test point is determined, and thus the period of semiconductor integrated circuit design may be prolonged.

The methods proposed by K. H. Tsai et al and G. Kiefer et al have not only the problem of a prolonged design period because the layout or wiring pattern cannot be determined without modifying the circuit which controls bit-flipping or the like depending on the result of test pattern generation (a time consuming process), and the scan chain, but also the problem that, for a large-scale CUT, the method by H. Tsai et al has a restriction on the way of scan chain arrangement, thereby increasing the overhead of wirings, while, in the method by G. Kiefer et al, the bit flipping control circuit must be increased. Regarding the Reseeding technique, although it has no problem of hardware overhead or a prolonged design period in comparison with the original BIST method, the number of seeds is expected to be equal to or larger than the number of stored patterns and thus the main objective of the BIST method, reduction of test data, is not satisfactorily achieved.

SUMMARY OF THE INVENTION

A major object of this invention is to realize a method for testing semiconductor integrated circuits or the like which provides a high fault coverage with a smaller volume of test data, and particularly a BIST-based such test method.

Another object of this invention is to realize a semiconductor circuit device in which a circuit added to embody the above-said test method does not depend on the CUT and is easy to design.

A further object of this invention is to realize a circuit device which causes no loss in operating speed due to the addition of the circuit to embody the above-mentioned test method and minimizes the overhead of hardware such as gates and wirings.

In order to achieve the above objects, this invention provides a semiconductor integrated circuit test method in which test pattern signals (hereinafter called "test patterns") as pseudo-random patterns are added to the CUT and the response pattern from that circuit is compared with the expected pattern;

wherein there are three steps of generating the above test patterns: a first step for generating an identical pattern sequence cluster at least once, where a pattern sequence cluster consists of plural pattern sequences with a given number of bits and a given number of times and all pattern sequences in such a cluster are identical; a second step for flipping some bits in the pattern sequences in said pattern sequence cluster; and a third step for changing the bits (bit positions) in each pattern to be flipped according to the pattern sequence cluster, pattern sequence number and time in pattern sequence in the cluster at the second step.

According to a semiconductor integrated circuit test method as a preferred embodiment of this invention, a pattern sequence cluster is applied to the CUT at least once, the cluster being composed of plural pattern sequences whose number of bits and maximum length of scan chain depend on the number of scan chains and the number of external input terminals and whose number of times depends on the unit test sequence length, where the cluster has one reference pattern sequence in the pattern sequence cluster and, in whole or in part, with respect to the reference pattern sequence, such pattern sequences as ones without flipped bits, ones with all or some bits flipped and ones with all or some flipped bits in plural consecutive patterns or patterns at regular intervals, the interval being equivalent to a given number of patterns are used.

Also, in order to embody the above-said semiconductor integrated circuit test method, the test pattern generator according to this invention comprises: an identical pattern sequence generator which generates an identical pattern sequence cluster at least once, where a pattern sequence cluster is composed of plural pattern sequences with a given number of bits and a given number of times and all pattern sequences in the cluster are all identical; and a bit-flipping sequence generator which uses the pattern sequence cluster generated by said identical pattern sequence generator as input, flips some bits in the pattern sequences in the cluster and changes the bits in the pattern to be flipped according to the pattern sequence cluster, pattern sequence number and time in pattern sequence in the cluster.

According to a preferred embodiment of the invention, when the above-said test pattern generator and the CUT are integrated into one semiconductor integrated circuit, there are two possible configurations: one is that the bit-flipping sequence generator in the-above test pattern generator and the CUT are integrated into a semiconductor integrated circuit, and the other is that the semiconductor integrated circuit consists of a test pattern generator which is independent of the CUT, where the test pattern generator or test pattern generating circuit independent of the CUT constitutes a semiconductor integrated circuit test device and the probe included in the semiconductor integrated circuit test device is to be connected with the external input terminal of the CUT in order to carry out a test.

The identical pattern sequence generator has a linear feedback shift register and a register which holds the seed in the linear feedback shift register, with a serial or parallel copy function for the registers in the linear feedback shift register having. In order to generate plural pattern sequence clusters as mentioned above, a register which holds plural initial values for registers in the linear feedback shift register may be provided.

In a semiconductor integrated circuit according this invention, a circuit for generating neighborhood patterns is added independently of the CUT, thereby avoiding the problem of a prolonged design period, eliminating the overhead concerning the operating speed of the CUT, and reducing hardware overhead to ensure a high fault coverage with less test data.

BRIEF DESCRIPTION OF THE DRAWINGS

Preferred embodiments of this invention will be described in detail based on the followings, wherein:

FIGS. 9(a), (b) and (c) are tables for operation of the identical pattern sequence generator;

FIG. 29 illustrates detailed operation in testing the semiconductor integrated circuit as shown in FIG. 28;

FIG. 30 illustrates detailed operation in testing the semiconductor integrated circuit as shown in FIG. 28;

DETAILED DESCRIPTION OF THE PREFERRED EMBODIMENTS

Next, preferred embodiments of this invention will be described referring to the attached drawings.

Figure 1:
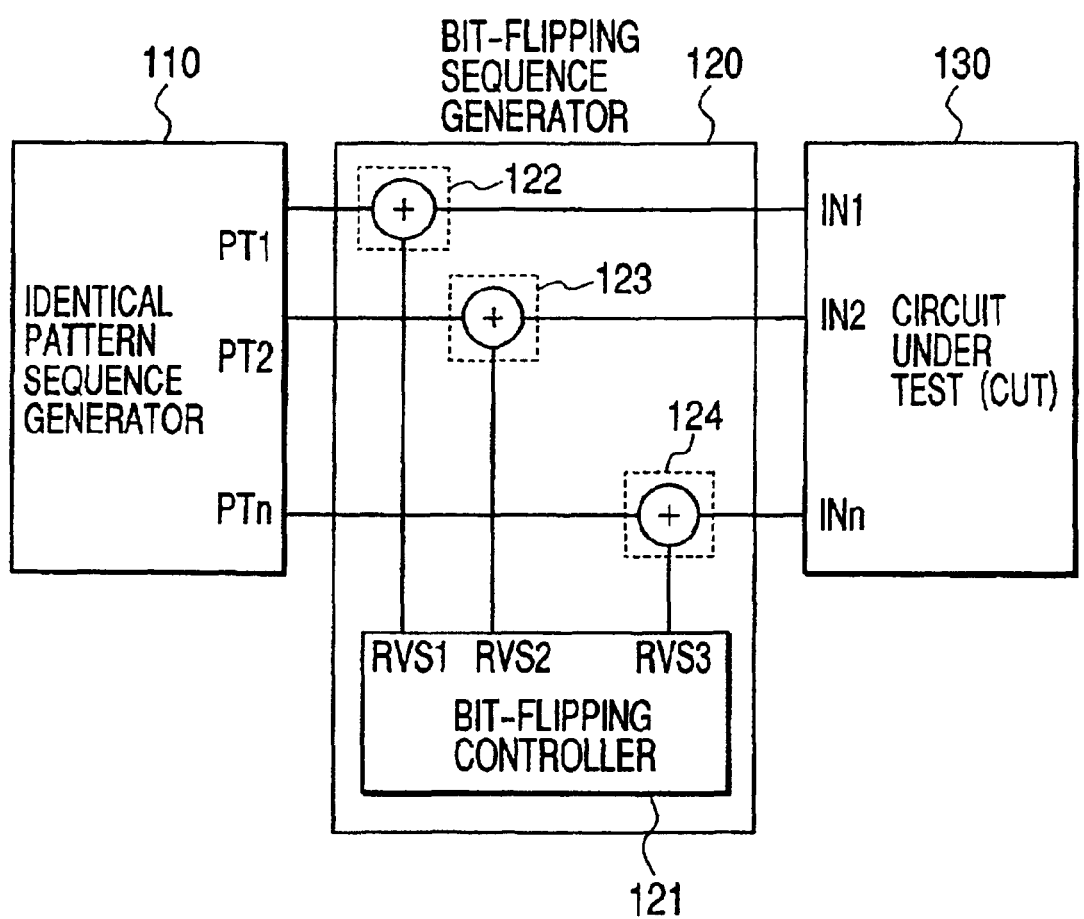
FIG. 1 shows the structure of a circuit which embodies the test method according to this invention.

FIG. 1 shows the structure of the circuit for embodying the test method according to this invention.

The circuit for embodying the test method according to the invention is composed of an identical pattern sequence generator 110, a bit-flipping sequence generator 120 and a circuit under test (CUT) 130. Output lines PT1, PT2, ... PTn in the identical pattern sequence generator 110 are inputted to the bit-flipping sequence generator 120, in which the output lines are inputted to input terminals IN1, IN2, ... INn in the CUT 130.

The identical pattern sequence generator 110 outputs patterns whose bit width corresponds to the number of output lines n, synchronously with clocks. Regarding patterns generated by the identical pattern sequence generator 110, on the assumption that patterns for a given number of times are called a pattern sequence, the bit-flipping sequence generator 120 outputs different pattern sequence clusters sequentially, where plural identical pattern sequences constitute what is called a "pattern sequence cluster."

The bit-flipping sequence generator 120 flips some bits in each pattern of the input pattern sequence cluster according to pattern sequence number and time in pattern sequence. The bit-flipping sequence generator 120 incorporates the following: a bit-flipping controller 121 which outputs a pattern representing the bit flipping positions in the input pattern with regard to each time (logical value 1 for only bits corresponding to bit flipping positions); and circuits 122 to 124 for obtaining exclusive OR for each bit in the input pattern in the bit-flipping sequence generator 120 depending on each bit in the pattern outputted by the bit-flipping controller 121.

A pattern sequence cluster outputted by the bit-flipping controller 121 comprises, in whole or in part, such pattern sequences as ones all of which components have logical value 0, and ones with all or some bits of logical value 1 in only one pattern and ones with all or some bits of logical value 1 in plural consecutive patterns or plural patterns at regular intervals, the interval being equivalent to a given number of patterns. Here, each of the pattern sequence clusters outputted by the bit-flipping sequence generator 120 comprises, in whole or in part, with respect to one reference pattern sequence, such pattern sequences as ones without flipped bits, ones with all or some flipped bits in one pattern and ones with all or some flipped bits in plural consecutive patterns or plural patterns at regular intervals, the interval being equivalent to a given number of patterns. The CUT 130 is a semiconductor circuit intended to be tested, among the circuits designed by the logic designer.

Figure 2A:
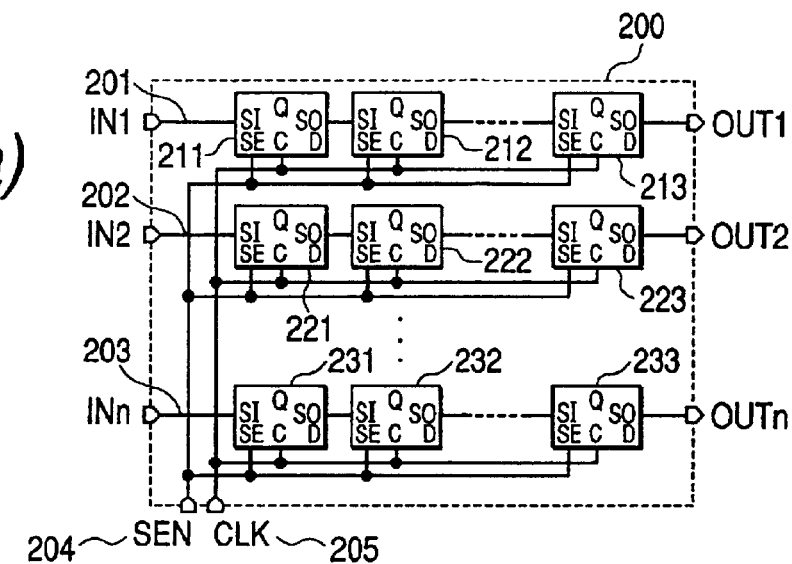
FIGS. 2(a), (b) and (c) show the circuits in the above-said test circuit.
Figure 2B:
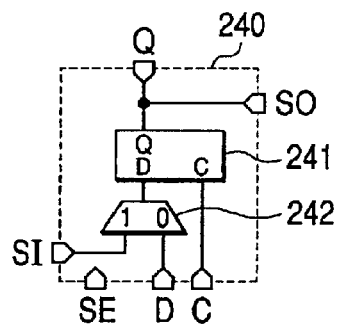
FIG. 28(a) shows the structure of a semiconductor integrated circuit having a test pattern generator according to a sixth embodiment of this invention and FIG. 2(b) illustrates a relevant test pattern set.

FIG. 2(a) shows a first example of the above-said CUT. The first example is a full scan design CUT 200, where all storage elements (211, 212 ... 233) in the CUT 200 are provided with a scan function to enable setting and reading during testing to test the CUT 200 as a combinational circuit. FIG. 2(b) shows the circuit 240 for a scan flip-flop as mentioned above. A selector 242 is added to a flip-flop 241 having clock input C, data input D and output Q, and if the logical value for input line SE is 0, the input value for input line D is stored (normal mode), while if it is 1, the input value for input line SI is stored (scan mode).

As shown in FIG. 2(a), scan flip-flops 211 to 213, 221 to 223, and 231 to 233 are serially connected on scan chains 201, 202 and 203, respectively. The figure shows only flip-flops or storage elements but omits the combinational circuit which is usually used in normal mode. Boundary scan flip-flops are inserted in external input terminals (not shown here). The CUT 200 operates as follows: when scan enable signal SEN for terminal 204 is 0, if clock CLK for terminal 205 is turned on, the circuit works in its normal mode, while it works in the mode of scan shift on each of scan chains 201, 202 and 203 if clock CLK is turned on when signal SEN is 1. Inputs IN1, IN2, ... INn in the CUT 200 are valid in the scan shift mode.

Figure 2C:
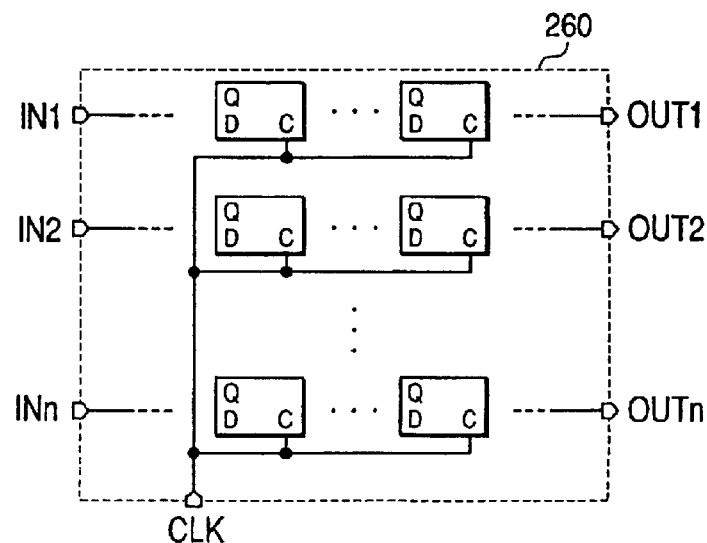

FIG. 2(c) shows a second example of the above-said CUT. The second example is a non-scan design CUT 260, where all flip-flops or storage elements (251, 252, 261, 262, 271, 272 and so on) in the CUT 200 have no scan function. Here, a signal line equivalent to an external input terminal serves as input INn for the CUT 260. In this case, the CUT 260 is tested as a sequential circuit.

As stated above, according to this embodiment, for any of full scan or non-scan design circuits, the test pattern generator, which comprises an identical pattern sequence generator 110 and a bit-flipping sequence generator 120, can generate neighborhood patterns known as valid for fault detection, or patterns having several bits flipped with respect to one reference pattern, thereby enabling a high fault coverage to be achieved by the BIST method when it is used in combination with the Reseeding method.

Here, the linear feedback shift register (LFSR) as a constituent part of the identical pattern sequence generator 110 is first explained below.

Figure 3:
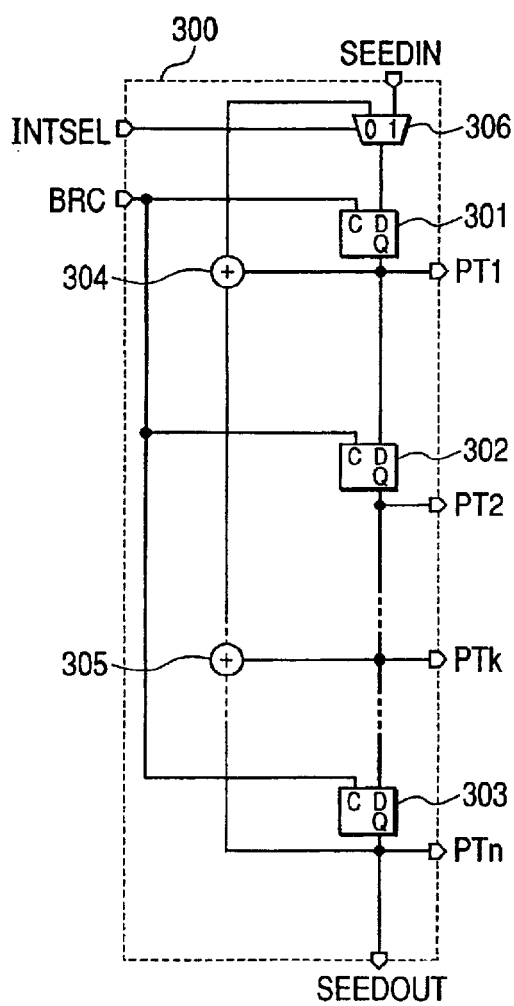
FIG. 3 is a circuit diagram for LFSR.

FIG. 3 shows an example of a linear feedback shift register which is of the same type as ones used in conventional test pattern generators. In LFSR 300, outputs from storage elements 301 to 303 which operate as shift registers, and from circuits 304 and 305 which obtain exclusive OR of the value of the bottom storage element 303 and the value of a specific storage element are fed back to the top storage element 301 through selector 306. Here, storage elements 301 to 303 are of the edge trigger type which imports data input when clock input changes. In the explanation given below, the state of shift registers within LFSR 300 is called "seed."

FIG. 9(a) shows mode data for LFSR 300. The condition that the logical value of input INTSEL is 1 is called an initialization mode, where storage elements 301 to 303 shift synchronously with input BRC and the initial value of seed can be set through input SEEDIN. The condition that the logical value of input INTSEL is 0 is called a pattern generation mode, where pseudo-random patterns are generated from outputs PT1, PT2, . . . PTn of the storage elements synchronously with input BRC.

The nature of LFSR is as follows: when n bit strings expressing, by 0 or 1, whether or not to use outputs of storage elements in n-bit LFSR for input of exclusive OR for feedback, are made to correspond to coefficient of the first or n-th degree term (0 or 1) in a polynomial of the n-th degree of the residue system of 2, if the polynomial is a primitive polynomial, or an irreducible polynomial, the cycle of patterns which are generated when the logical values of all the components of seed in n-bit LFSR are other than 0 is the maximum, or 2 raised to the n-th power minus 1. For example, in the residue system of 2, since polynomial of the fourth degree $X^4+X+1=0$ is a primitive polynomial, if LFSR 300 is a 4-bit register, the cycle of generated patterns is maximized to 15 by feeding back the exclusive OR of outputs PT1 and PT4.

FIGS. 4, 5, 6, 7 and 8 show examples of the circuit of the identical pattern sequence generator 110 according to the above embodiment of the invention.

Figure 4:
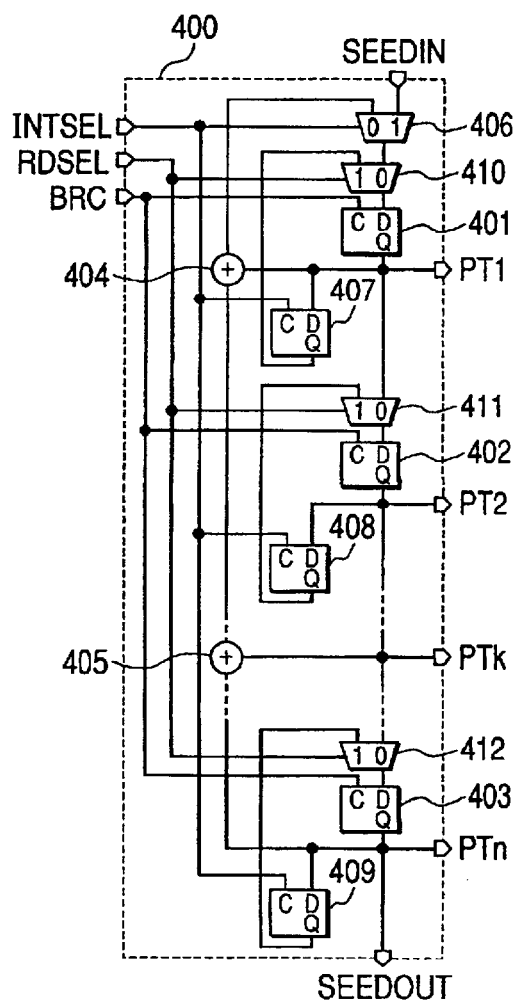
FIG. 4 shows circuit example 1 for the identical pattern sequence generator in the test pattern generator according to one embodiment of the invention.

FIG. 4 shows LFSR 400 which enables parallel seed recovery, as a first example of the circuit of the identical pattern sequence generator 110. Outputs of storage elements 401 to 403 which operate as shift registers, and exclusive ORs 404 and 405 of the value of the bottom storage element 403 and the value of a specific storage element are fed back to the top storage element 401 through selector 406. This feedback structure is the same as for LFSR 300 as shown in FIG. 3. To store the seed, storage elements (seed backup registers) 401 to 403 are paired with storage elements 407 to 409 and seed recovery is controlled by selectors 410 to 412.

FIG. 9(b) shows mode data for LFSR 400. The condition that clock BRC is applied with the logical value of input INTSEL 1 and that of input RDSEL 0 is called an initialization mode, where storage elements 401 to 403 shift synchronously with clock BRC and the initial value of seed is set through input SEEDIN. The seed is copied to storage elements 407 to 409 in parallel. The condition that the logical value of input INTSEL is 0 and that of RDSEL is 0 is called a pattern generation mode, where pseudo-random patters are generated from outputs PT1, PT2, . . . PTn of storage elements 401 to 403 synchronously with clock BRC so that the values of storage elements 407 to 409 are held. The condition that the logical value of input INTSEL is 0 and that of RDSEL is 1 is called a seed recovery mode, where the values of storage elements 407 to 409 are recovered as seed in parallel or simultaneously in storage elements 401 to 403 synchronously with clock BRC. The condition that clock BRC is not applied with the logical value of input INTSEL 1 and that of input RDSEL 0 is called a seed update mode, where the values of storage elements 401 to 403 are copied to storage elements 407 to 409 in parallel.

Figure 5:
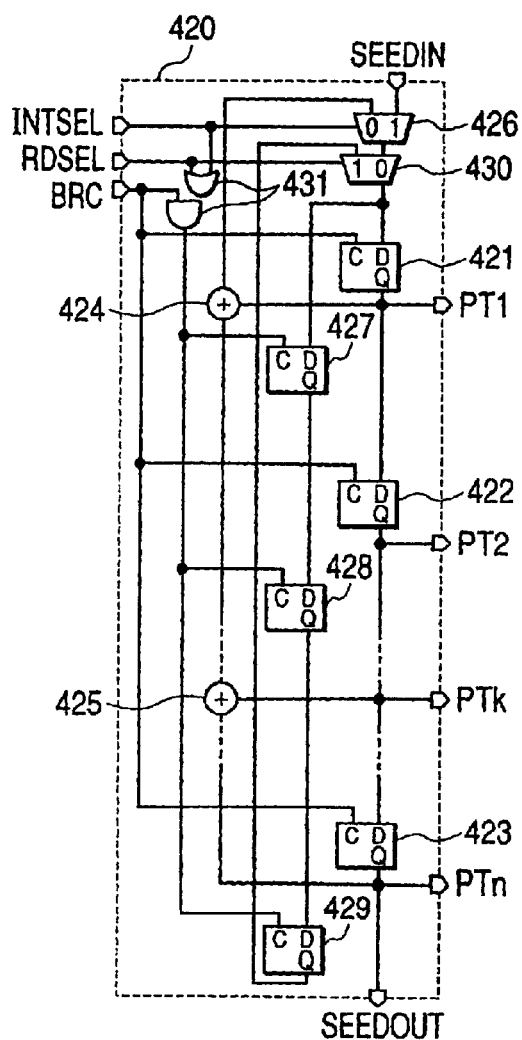
FIG. 5 shows circuit example 2 for the identical pattern sequence generator in the test pattern generator according to one embodiment of the invention.

FIG. 5 shows LFSR 420 which enables serial seed recovery, as a second example of the circuit of the identical pattern sequence generator 110. Outputs of storage elements 421 to 423 which operate as shift registers, and outputs of exclusive ORs 424 and 425 of the value of the bottom storage element 423 and that of a specific storage element are fed back to the top storage element 421 through selector 426. This feedback structure is the same as for LFSR 300 as shown in FIG. 3. To store the seed, storage elements (seed backup registers) 421 to 423 are paired with storage elements 427 to 429 and seed recovery is controlled by selector 430.

FIG. 9(c) shows mode data for LFSR 420. The condition that clock BRC is applied with the logical value of input INTSEL 1 and that of input RDSEL 0 is called an initialization mode, where storage elements 421 to 423 shift synchronously with clock BRC and the initial value of seed is set through input SEEDIN. The seed is copied to storage elements 427 to 429 in serial. The condition that the logical value of input INTSEL is 0 and that of RDSEL is 0 is called a pattern generation mode, where pseudo-random patterns are generated from outputs PT1, PT2, . . . PTn of the storage elements synchronously with clock BRC so that the values of storage elements 427 to 429 are held. The condition that the logical value of input INTSEL is 0 and that of input RDSEL is 1 is called a seed recovery mode, where the values of storage elements 427 to 429 are recovered as seed serially in storage elements 421 to 423 synchronously with clock BRC.

Figure 6:
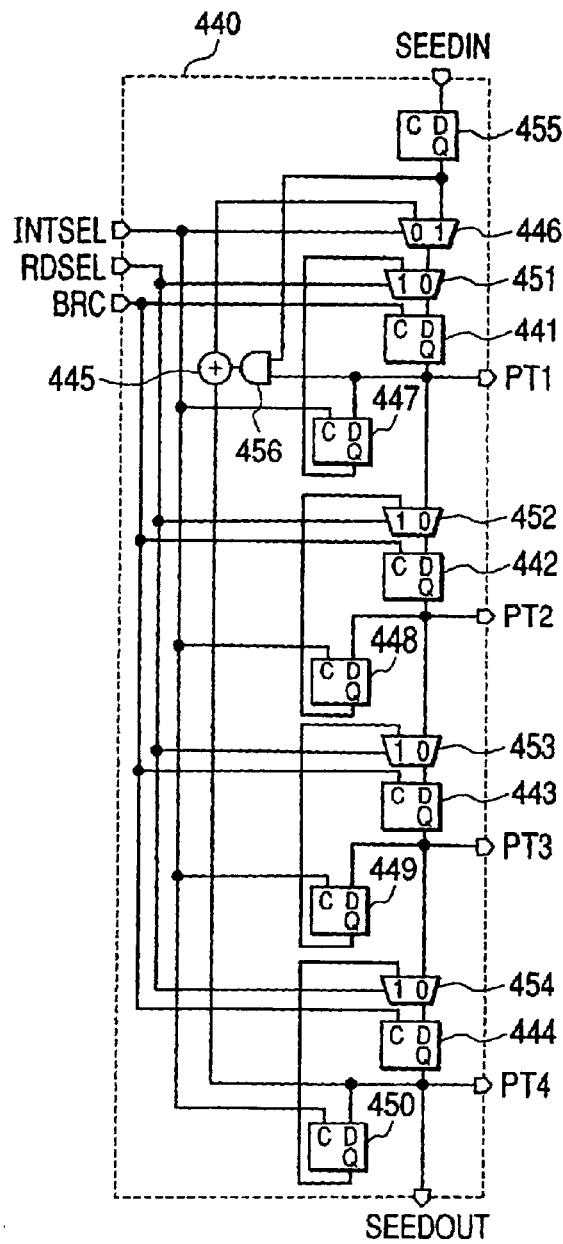
FIG. 6 shows circuit example 3 for the identical pattern sequence generator in the test pattern generator according to one embodiment of the invention.

FIG. 6 shows LFSR 440 which deals with a plurality of polynomials for parallel seed recovery, as a third example of the circuit of the identical pattern sequence generator 110. The figure assumes that LFSR has four bits. The structure in which outputs of storage elements 441 to 444 which operate as shift registers, and output of the circuit 445 for exclusive OR of the value of the bottom storage element 444 and that of the top storage element 441 are fed back to the top storage element 441 through selector 446, as well as the storage elements 447 to 450 for seed storage and the selectors 451 to 454 for seed recovery control are the same as those for LFSR 400. The difference is that, in LFSR 440, the input of the circuit 445 for exclusive OR is connected with the output terminal of AND element 456 and part of the input of the exclusive OR circuit for feedback is masked according to the setting of storage element 455.

This configuration makes it possible that there can be a plurality of polynomials in the residue system of 2 which are matched to LFSR. In the example shown here, such polynomials are $x^4+x+1=0$ (primitive polynomial) and $x^4+1=0$ (shift register). LFSR 440 operates in the same way as LFSR 400, except that it is necessary to set a value for storage element 455 which controls the input of the exclusive OR circuit for feedback in the initialization mode.

Figure 7:
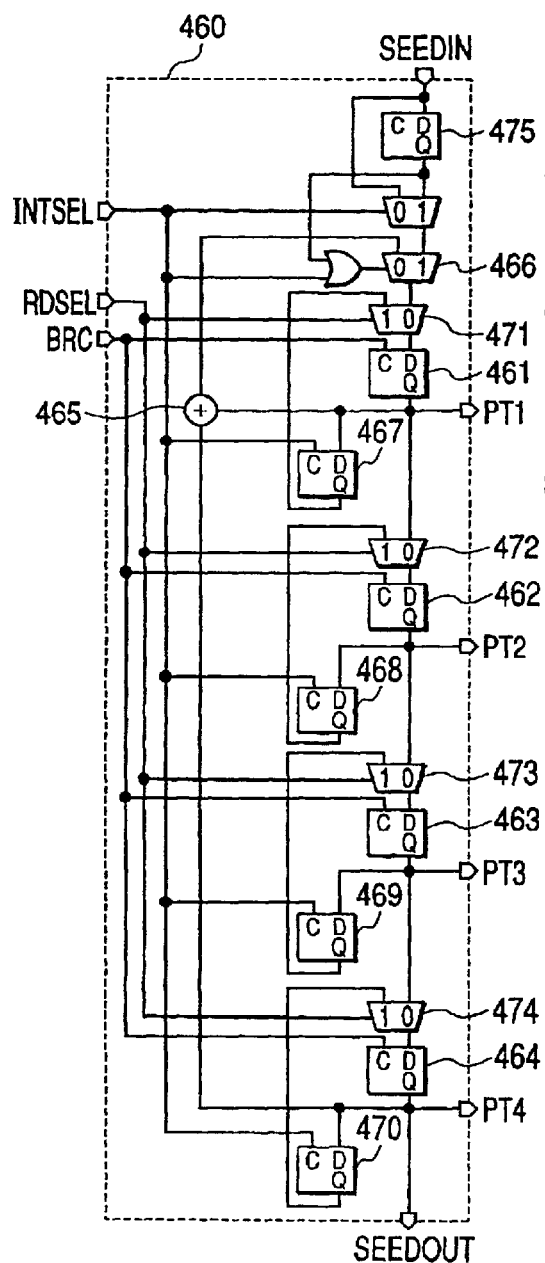
FIG. 7 shows circuit example 4 for the identical pattern sequence generator in the test pattern generator according to one embodiment of the invention.

FIG. 7 shows LFSR 460 which enables parallel seed recovery and pattern generation by shift, as a fourth example of the circuit of the identical pattern sequence generator 110. The structures of 4-bit shift registers 461 to 464 and seed recovery storage elements 467 to 470 of LFSR 460 are identical to those of LFSR 440, except that, in the pattern generation mode, if the logical value of storage element 475 is 0, the exclusive OR of values of shift registers 461 and 464 is fed back to storage element 461, while if it is 1, the value from input SEEDIN is brought into shift registers 461 to 464 through storage element 475. This is used for another LFSR state in the identical pattern sequence generator having a plurality of LFSRs which will be explained later by reference to FIG. 17.

Figure 8:
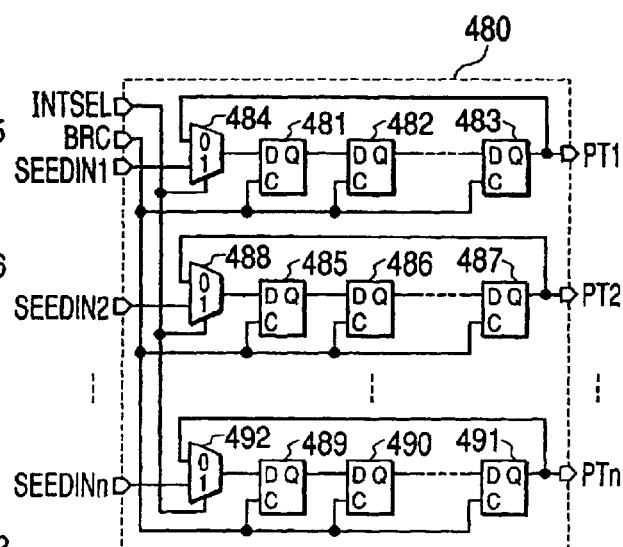
FIG. 8 shows circuit example 5 for the identical pattern sequence generator in the test pattern generator according to one embodiment of the invention.

FIG. 8 shows a group of shift registers 480 as a fifth example of the circuit of the identical pattern sequence generator 110. When the input INTSEL logical value is 1, storage elements 481 to 483 and selector 484, storage elements 485 to 487 and selector 488, and storage elements 489 to 491 and selector 492, set initial values from inputs SEEDIN1, SEEDIN2, . . . SEEDINn, respectively, by shifting synchronously with input BRC; on the other hand, when the INTSEL logical value is 0, they work as shift registers and a pattern signal which is composed of values of last storage elements 483, 487 and 491 is generated from outputs PT1, PT2, . . . PTn.

The major features of the above-mentioned five examples of the circuit of the identical pattern sequence generator 110 can be summarized as follows. In the first example LFSR 400, parallel seed recovery is done so the test time can be shortened. In the second example LFSR 420, serial seed recovery is done so the test time is prolonged but the overhead of gates is smaller than in LFSR 400. The third example LFSR 460 can have a plurality of LFSR polynomials. When the fourth example LFSR 480 has more than one LFSR, another LFSR state can be used for pattern generation. In the fifth example, though the overhead of gates and the volume of data required for setting all storage elements are considerable, all pattern sequence combinations can be represented.

Next, the detailed structure of the bit-flipping controller 121 will be explained. The explanation will assume that the number of patterns in a pattern sequence is 256.

Figure 10:
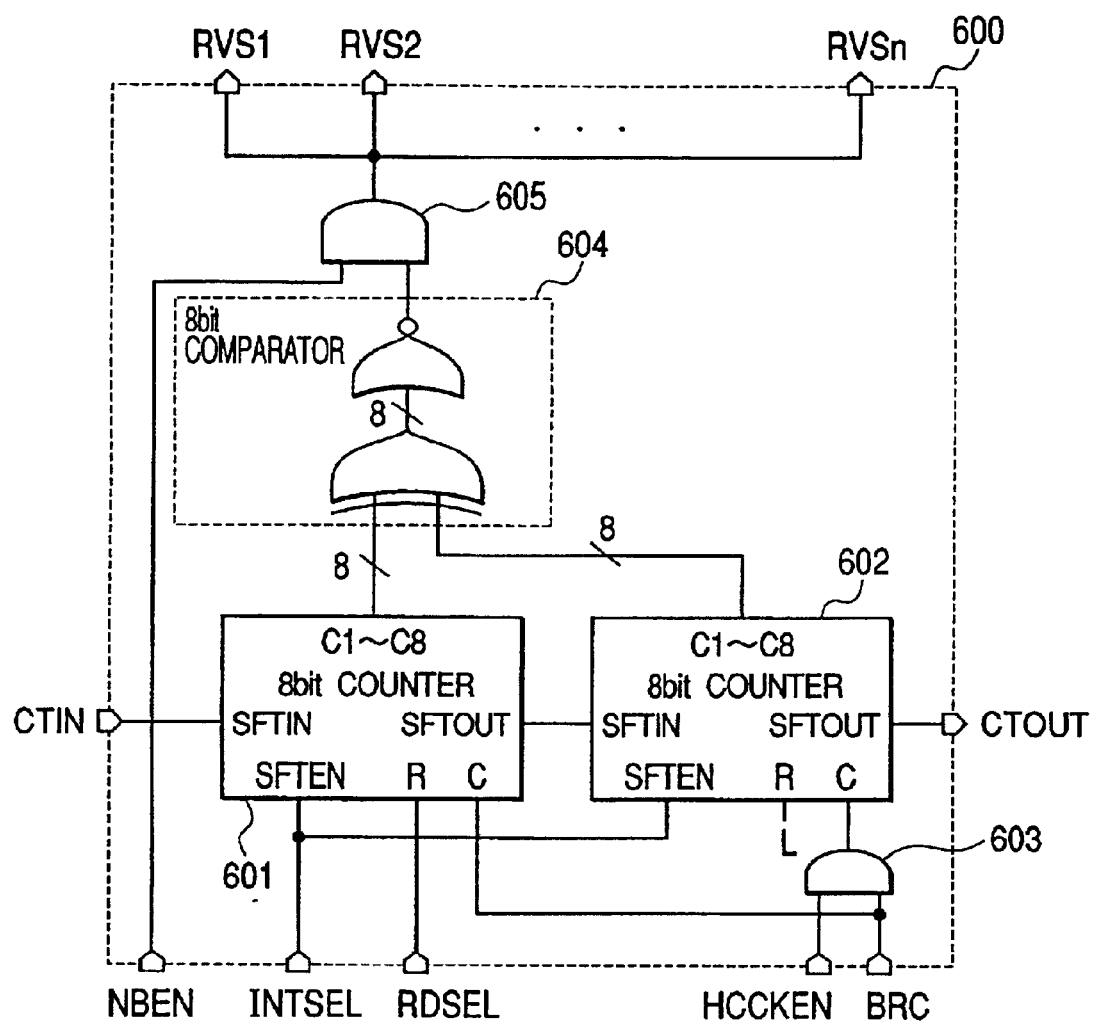
FIG. 10 shows circuit example 1 for the bit-flipping controller in the test pattern generator according to one embodiment of the invention.

FIG. 10 shows a first example 600 of the circuit of the bit-flipping controller 121. The bit-flipping controller 600 outputs 256 kinds of pattern sequences which include only one pattern all of which bits have logical value 1. The bit-flipping controller 600 comprises: an B-bit counter 601 for time in pattern sequence which has outputs C1–C2; an 8-bit counter 602 for pattern sequence number which has outputs C1–C2; and a comparator 604 which determines whether or not the value of the counter 601 agrees with that of the counter 602. The output is distributed to n outputs RVS1, RVS2, . . . RVSn through the AND element 605 for masking. Clock BRC is used as clock C for the counter 601 for time in pattern sequence while the AND (logical product) element 603 for clock BRC and input HCCKEN supplies clock C for the pattern sequence number counter 602.

Figures 14A, 14B:
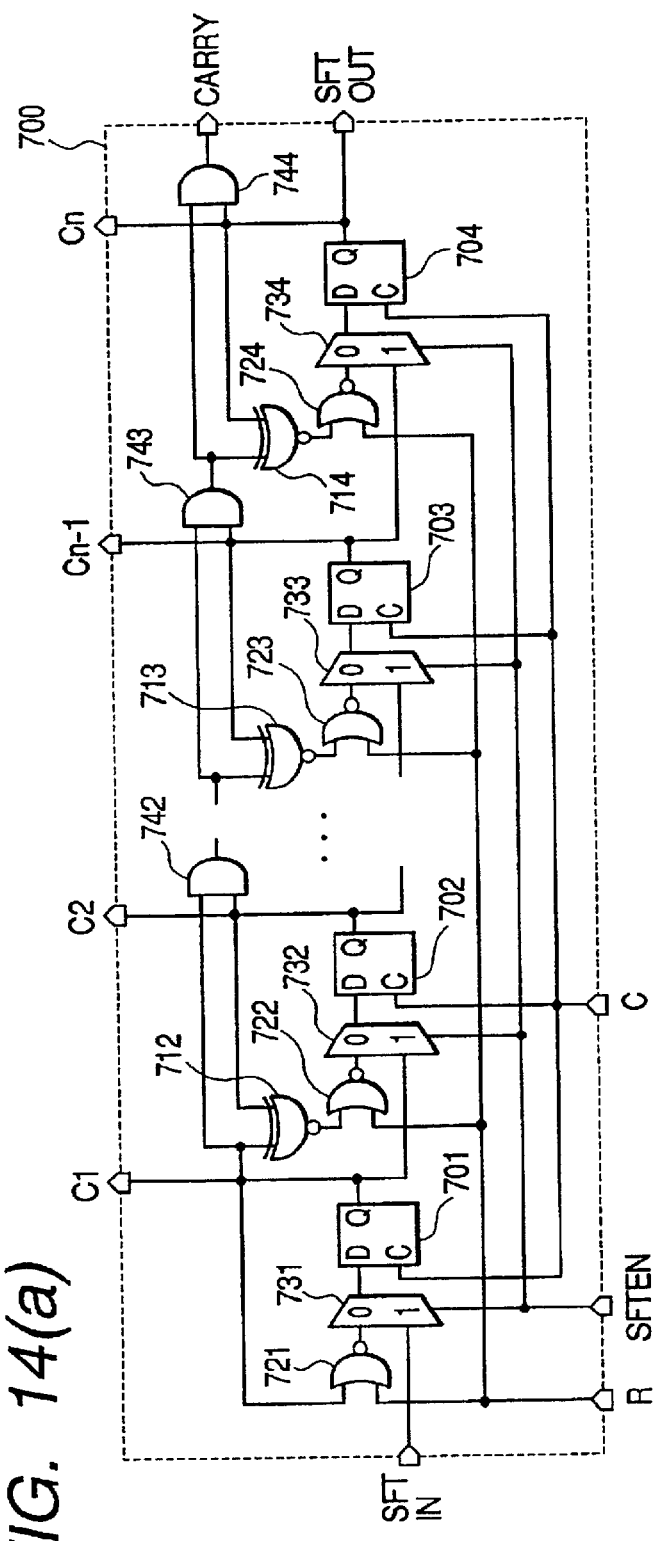
FIGS. 14(a) and (b) are a circuit diagram and an operation data table for the n-bit counter as used in said bit-flipping controller, respectively.

FIG. 14(*a*) shows an example of the circuit of the n-bit counter used in the bit-flipping controller 600. The n-bit counter 700 is composed of the following: storage elements 701 to 704 which represent the counter state; storage elements 712 to 714 for calculation of exclusive OR; storage elements 721 to 724 which reset the counter to zero; and selectors 731 to 734 which select either the function as a counter or the shift function. The counter state is outputted by n outputs C1, C2, . . . Cn.

FIG. 14(*b*) shows mode data for counter 700. The condition that the logical value of input SFTEN is 1 and that of input R is 0 is called a shift mode, in which storage elements 701 to 704 shift synchronously with clock C through input SFTIN to set an initial value for the counter. The condition that the logical value of input SFTEN is 0 and that of input R is 1 is called a reset mode, in which the counter is reset to zero synchronously with clock C. The condition that the logical value of input SFTEN is 0 and that of input R is 0 is called an increment mode, in which the counter is incremented by 1 synchronously with clock C.

Next, the operation modes for the bit-flipping controller 600 will be explained. With the logical value of input INTSEL 1, that of input RDSEL 0 and that of input HCCKEN 1, the contents of the storage elements in the two counters 601 and 602 shift synchronously with clock BRC, so their initial values can be set through input CTIN. With the logical value of input INTSEL 0 and that of input RDSEL 1, the counter 601 for time in pattern sequence is set to zero (all storage elements are set to zero) synchronously with clock BRC. With the logical value of input INTSEL 0, that of input RDSEL 0 and that of input HCCKEN 0, only the counter 601 for time in pattern sequence is incremented by clock BRC; if the logical value of HCCKEN is 1, the two counters 601 and 602 are incremented by clock BRC. Also, if the logical value of NBEN is always 1 in a pattern sequence, a pattern all of which components have logical value 1 only when the values of the two counters agree is generated, and all other output patterns have logical value 0. When the logical value of input NBEN in pattern sequences is always 0, pattern sequences all of which components have logical value 0 will be generated.

Figure 11:
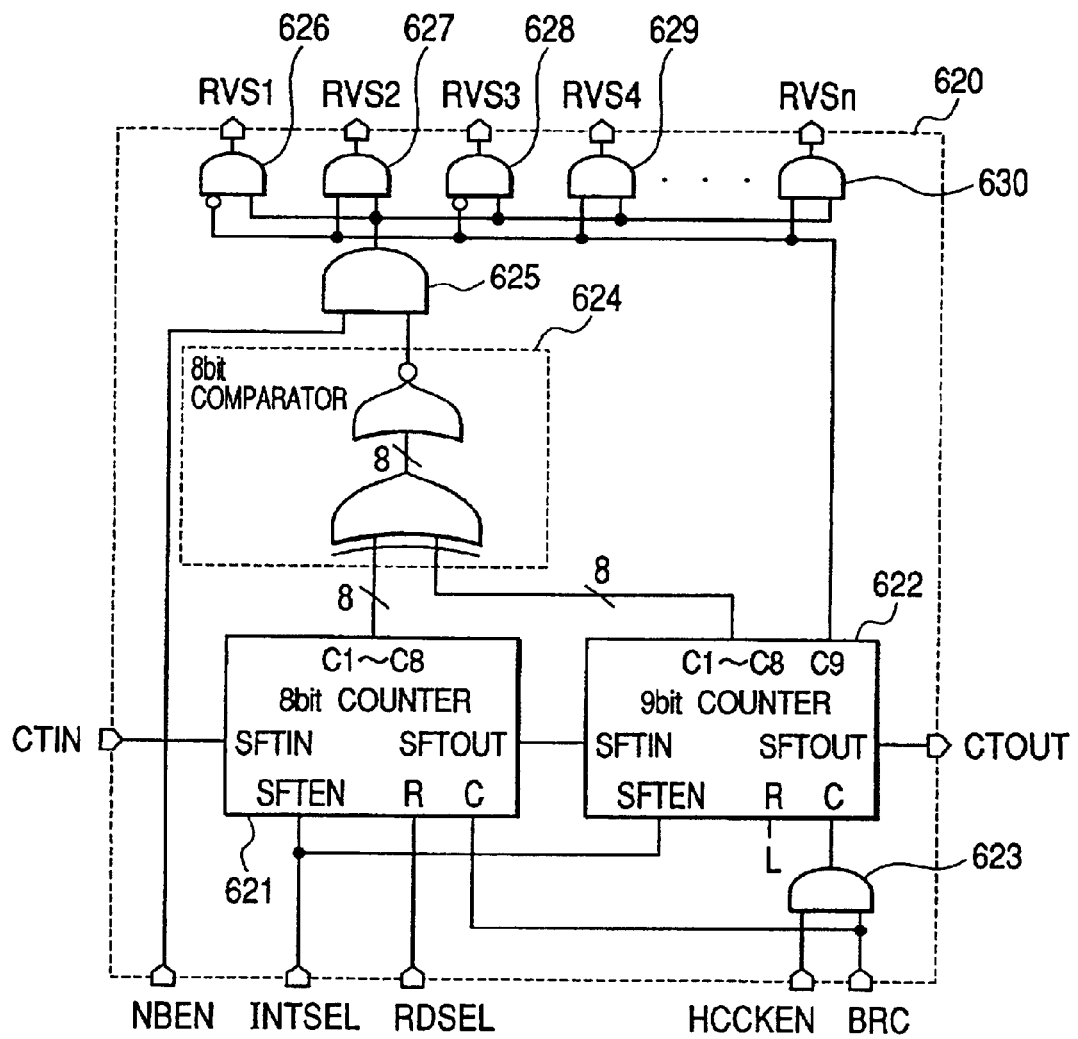
FIG. 11 shows circuit example 2 for the bit-flipping controller in the test pattern generator according to one embodiment of the invention.

FIG. 11 shows a second example of the circuit of the bit-flipping controller 121. The bit-flipping controller 620 outputs 512 kinds of pattern sequences which each include only one pattern the half of which bits have logical value 1. The bit-flipping controller 620 comprises a counter 621 for time in pattern sequence and a comparator 624; its AND element 625 for masking and the AND element 623 for input HCCKEN are identical to the AND element 605 and AND element 603 of the bit-flipping controller 600. The counter 622 for pattern sequence number has such a structure that the 9th bit C9 is added to the same structure as that of the pattern sequence number counter 602 in the bit-flipping controller 600. The logical value of bit C9 or its inverse is connected with n outputs RVS1, RVS2, . . . RVSn through AND elements 626 to 630. In the circuit as shown in FIG. 11, if the logical value of the 9th bit C9 in the pattern sequence number counter 622 is 0, patterns where only RVS1, RVS3 and so on have logical value 1 are generated, while if it is 1, patterns where only RVS2, RVS4 and so on have logical value 1 are generated.

Figure 12:
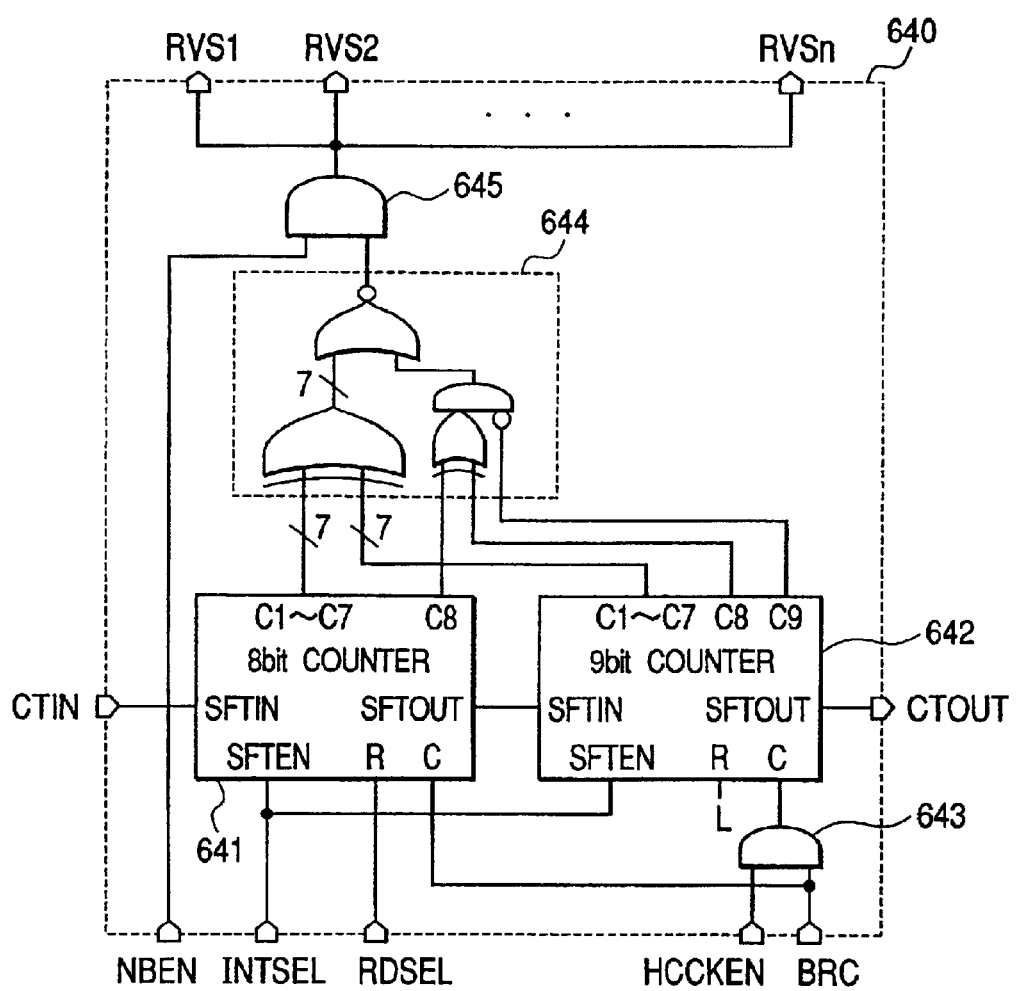
FIG. 12 shows circuit example 3 for the bit-flipping controller in the test pattern generator according to one embodiment of the invention.

FIG. 12 shows a third example of the circuit of the bit-flipping controller 121. The bit-flipping controller 640 outputs 256 kinds of pattern sequences which each include only one pattern all of which bits have logical value 1 and 256 kinds of pattern sequences which each include, on a cycle of 128, two patterns all of which bits have logical value 1, that is 512 kinds of pattern sequences in total. The bit-flipping controller 640 comprises a counter 641 for time in pattern sequence; its AND element 645 for masking and the AND element 643 for input HCCKEN are identical to the AND element 605 and AND element 603 of the bit-flipping controller 600.

The counter 642 for pattern sequence number has such a structure that the 9th bit C9 is added to the AND element 605 and the AND element 603; the circuit 644 is a modified version of the above-said comparator 604 in which some function has been modified. If the logical value of the 9th bit C9 in the pattern sequence number counter 642 is 0, the circuit 644 works in the same way as a conventional 8-bit comparator, but if the logical value of the 9th bit C9 is 1, its works as a comparator which uses the lower 7 bits. As a consequence, if the logical value of the 9th bit C9 in the pattern sequence number counter 642 is 0, pattern sequences which each include only one pattern all of which bits have logical value 1 are generated; if it is 1, pattern sequences which include, on a cycle of 128, two patterns all of which bits have logical value 1, are generated.

Figure 13:
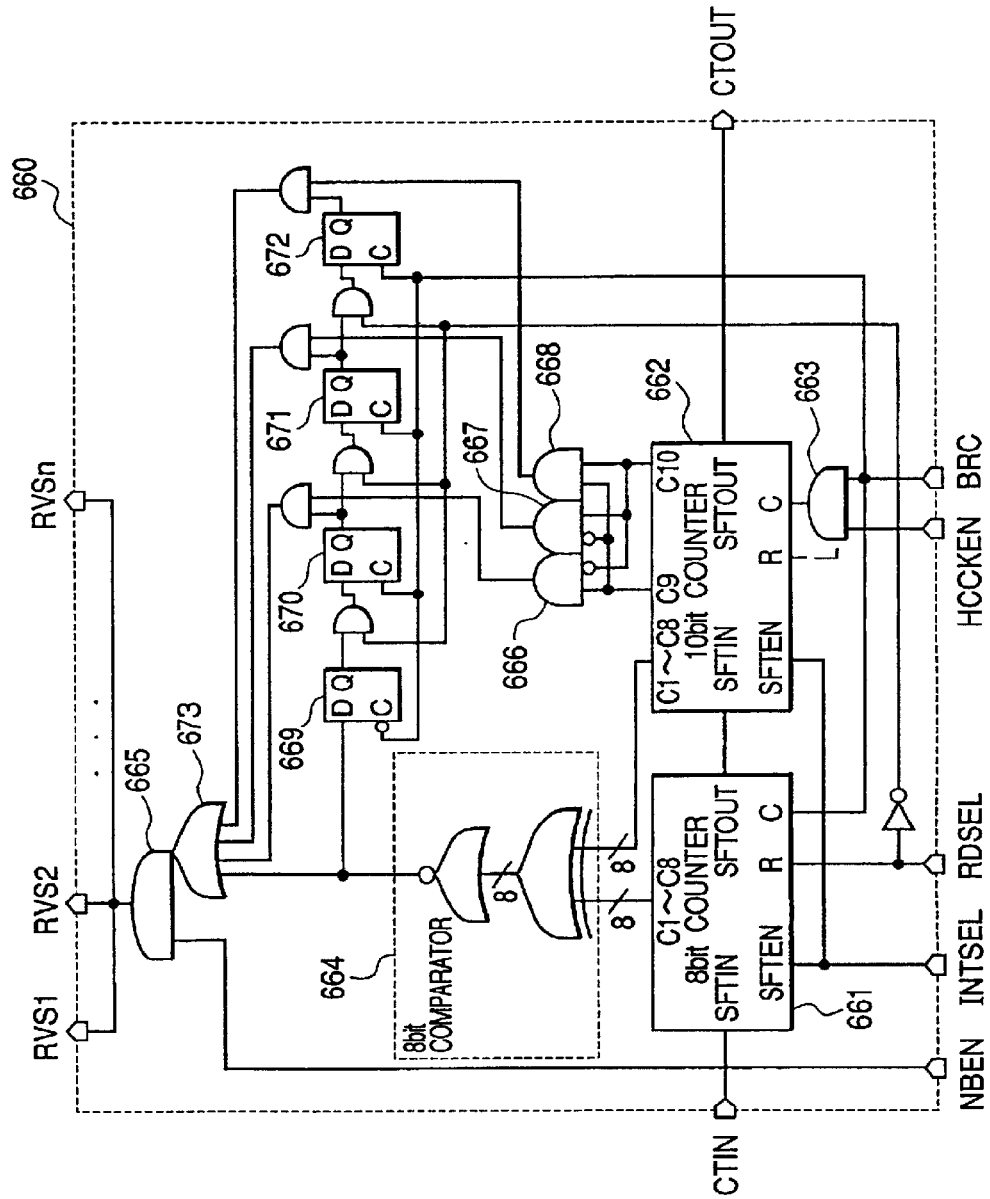
FIG. 13 shows circuit example 4 for the bit-flipping controller in the test pattern generator according to one embodiment of the invention.

FIG. 13 shows a fourth example of the circuit of the bit-flipping controller 121. The bit-flipping controller 660 outputs a total of 1024 kinds of pattern sequences: 256 kinds of pattern sequences which each include only one pattern all of which bits have logical value 1, 256 kinds of pattern sequences which each include two patterns serial in time all of which bits have logical value 1, 256 kinds of pattern sequences which each include two patterns with all bits of logical value 1, spaced at an interval equivalent to one time, and 256 kinds which each include two patterns with all bits of logical value 1, spaced at an interval equivalent to 2 times.

The bit-flipping controller 660 comprises a counter 661 for time in pattern sequence, an AND element 665 for masking and an AND circuit 663 for input HCCKEN and signal BRD. These are identical to the counter 601 for time in pattern sequence, the comparator 604, the AND element 605 for masking and the AND circuit 603 of the bit-flipping controller 600. The counter 662 for pattern sequence number has such a structure that the 9th bit C9 and 10th bit C10 are added to the same structure as that of the counter 602 of the bit-flipping controller 600. The AND elements 666 to 668 control the output of the 9th bit C9 and 10th bit C10 of the counter 662. If both the logical values of bits C9 and C10 are 0, the AND elements 666 to 668 all output logical value 0; if C9 is 1 and C10 0, only the AND element 666 outputs logical value 1; if C9 is 0 and C10 1, only the AND element 667 outputs logical value 1; and if both C9 and C10 are 1, only the AND element 668 outputs logical value 1.

Storage elements 669 to 672 memorize the output values of the comparator 664 at the current time, one time before, two times before and 3 times before. The OR element 673 has four inputs: the output value of the comparator 604; the logical product of the storage element 670 holding the comparator 664's output value one time before, and the AND element 666's output value; the logical product of the storage element 671 holding the comparator 664's output value two times before, and the AND element 668's output value; and the logical product of the register 672 holding the comparator 664's output value three times before, and the AND element 668's output value. If one of these inputs is 1, logical value 1 is conveyed to outputs RVS1, RVS2, . . . RVSn. As a consequence, if both the logical values of the 9th and 10th bits or C9 and C10, in the pattern sequence number counter 662 are 0, pattern sequences which each include only one pattern all of which bits have logical value 1 are generated; if C9 is 1 and C10 is 0, pattern sequences which each include two patterns serial in time all of which bits have logical value 1 are generated; if C9 is 0 and C10 is 1, pattern sequences which each include two patterns with all bits of logical value 1, spaced at an interval equivalent to one time are generated; if C9 and C10 are both 1, pattern sequences which each include two patterns with all bits of logical value 1, spaced at an interval equivalent to two times are generated.

Regarding the number of bits for each counter in the bit-flipping controller 121, for instance, the counter 601 for time in pattern sequence in the bit-flipping controller 600 has 8 bits; the counter cycle of 256 which is derived from this number of bits indicates the upper limit for the number of patterns in a pattern sequence but the number of bits should not be limited to 8. If the number of patterns in a pattern sequence is larger than the cycle of the counter 601 for time in pattern sequence, the bit-flipping controller 600 sequentially outputs pattern sequences in which patterns with all bits of logical value 1 are generated on the corresponding cycle.

On the other hand, though the counter 602 for pattern sequence number has 8 bits, the counter cycle of 256 which is derived from this number of bits indicates the upper limit for the number of pattern sequences in a pattern sequence cluster but it is also possible that the number of bits for the counter is other than 8. If the number of pattern sequences in a pattern sequence cluster should be larger than the cycle of the counter 602 for pattern sequence number, only identical pattern sequences would be generated, so such a case is not assumed. The above consideration concerning the number of bits for each counter is applicable to the other examples of the bit-flipping controller 121.

In preferred embodiments, the test pattern generator, bit-flipping sequence generator and bit-flipping controller as mentioned above may be independent of each other or combined to make up a semiconductor integrated circuit. Next, embodiments of a semiconductor integrated circuit according to this invention will be explained.

Figures 15A, 15B:
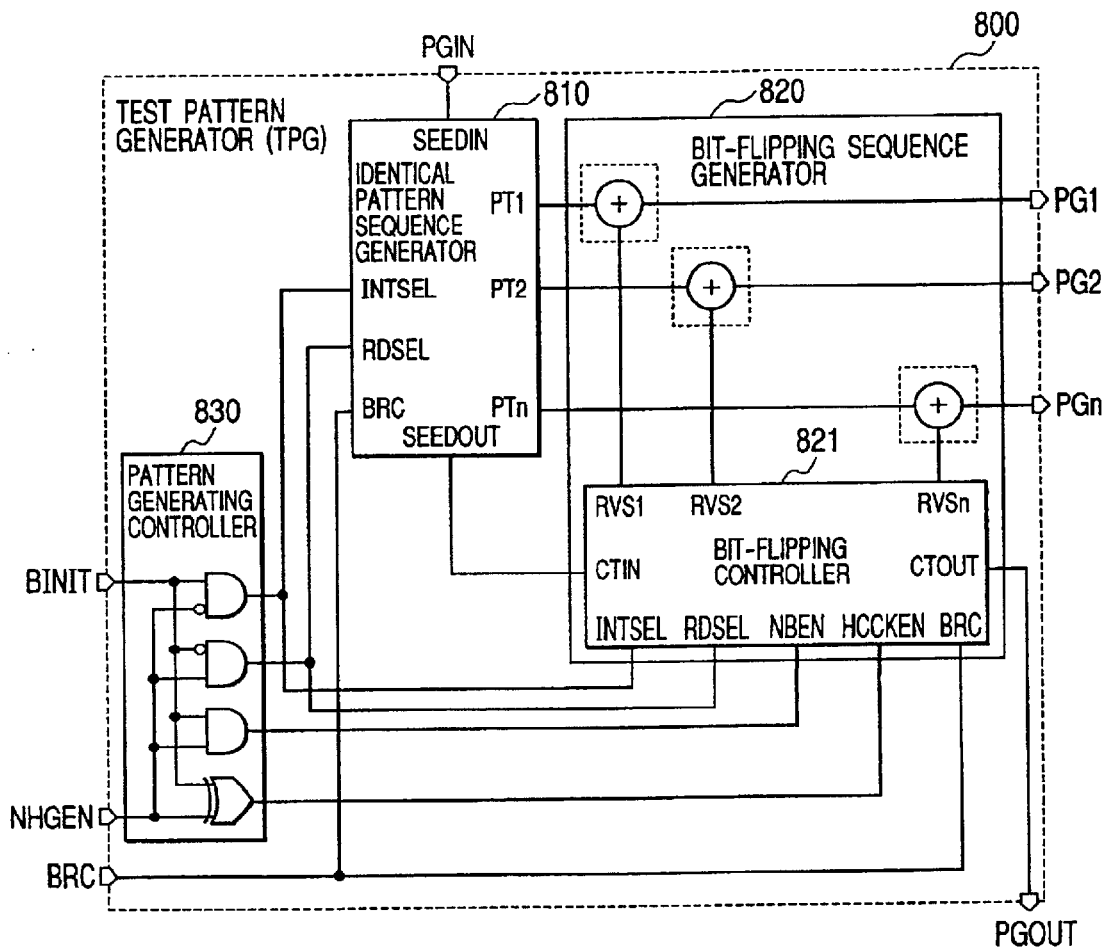
FIG. 15(a) shows the structure of a semiconductor integrated circuit (test pattern generator) having a test pattern generator according to a first embodiment of this invention and FIG. 15(b) is an operation data table for it.

FIG. 15(*a*) shows the structure of a first embodiment of a semiconductor integrated circuit having a test pattern generator according to this invention. A semiconductor integrated circuit 800 (test pattern generator) comprises an identical pattern sequence generator 810, a bit-flipping sequence generator 820, and a pattern generating controller 830. The identical pattern sequence generator 810 may be either of the identical pattern sequence generators 400, 420 and 440 as shown in FIGS. 4, 5 and 6, respectively. The bit-flipping controller 821 in the bit-flipping sequence generator 820 may be either of the bit-flipping controllers 600, 620, 640 and 660 as shown in FIGS. 10, 11, 12 and 13, respectively. The pattern generating controller 830 is a decoder which turns outputs INTSEL, RDSEL, NBEN and HCCKEN from two inputs BINIT and NHGEN into four signals. FIG. 15(*b*) shows different combinations of the two inputs with the four outputs and the relevant modes.

In the initialization mode 841, the initial value for the identical pattern sequence generator 810 is set on the storage elements in the identical pattern sequence generator 810 and bit-flipping controller 821 serially through input SEEDIN. In the pattern generation mode 842, the identical pattern sequence generator 810 works as LFSR to generate pseudo-random patterns sequentially and the bit-flipping controller 821 continues to output patterns all of which components RVS1, RVS2, . . . RVSn have logical value 0, so the test pattern generator 800 outputs the pseudo-random patterns generated by the identical pattern sequence generator 810 as they are. In the seed recovery mode 843, the seed is recovered in parallel or serial into the register which has once stored it, in the identical pattern sequence generator to reset the counter for time in pattern sequence in the bit-flipping controller 821 to zero.

In the neighborhood pattern generation mode 844, neighborhood patterns are generated, where neighborhood patterns include, in whole or in part, with respect to the reference pattern sequence, such pattern sequences as ones without flipped bits, ones with all or some flipped bits in one pattern and ones with all or some flipped bits in plural consecutive patterns or patterns at regular intervals, the interval being equivalent to a given number of patterns. In the explanation given below, among neighborhood patterns generated by the test pattern generator 800, the reference pattern sequence is called the parent pattern and other pattern sequences with some flipped bits with respect to the reference pattern are called child patterns.

Figure 16:
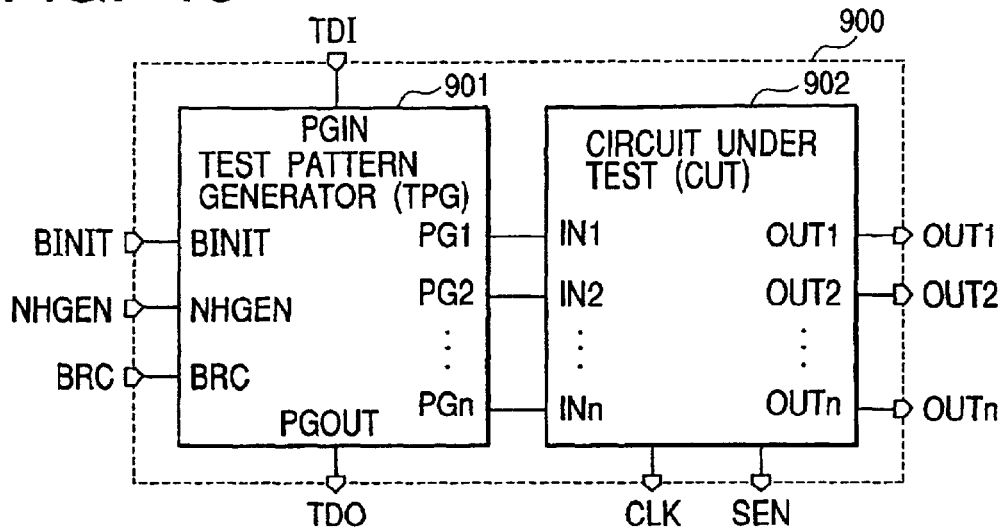
FIG. 16 shows the structure of a semiconductor integrated circuit (test pattern generator) having a test pattern generator according to a second embodiment of this invention.

FIG. 16 shows the structure of a second embodiment of a semiconductor integrated circuit having a test pattern generator according to this invention. The semiconductor integrated circuit 900 is composed of a test pattern generator 901 and a circuit under test (CUT) 902. The test pattern generator 901 has the same structure as the test pattern generator 800 shown in FIG. 15(a), where any combination of the relevant circuits mentioned above may be used for the identical pattern sequence generator 810 and the bit-flipping sequence generator 820. The circuit under test 902 may be either CUT 200 shown in FIG. 2(a) or CUT 260 as shown in FIG. 2(c). In this embodiment, neighborhood patterns which are valid for fault detection can be generated and thus a high fault coverage can be achieved with a smaller volume of test data.

Figure 17:
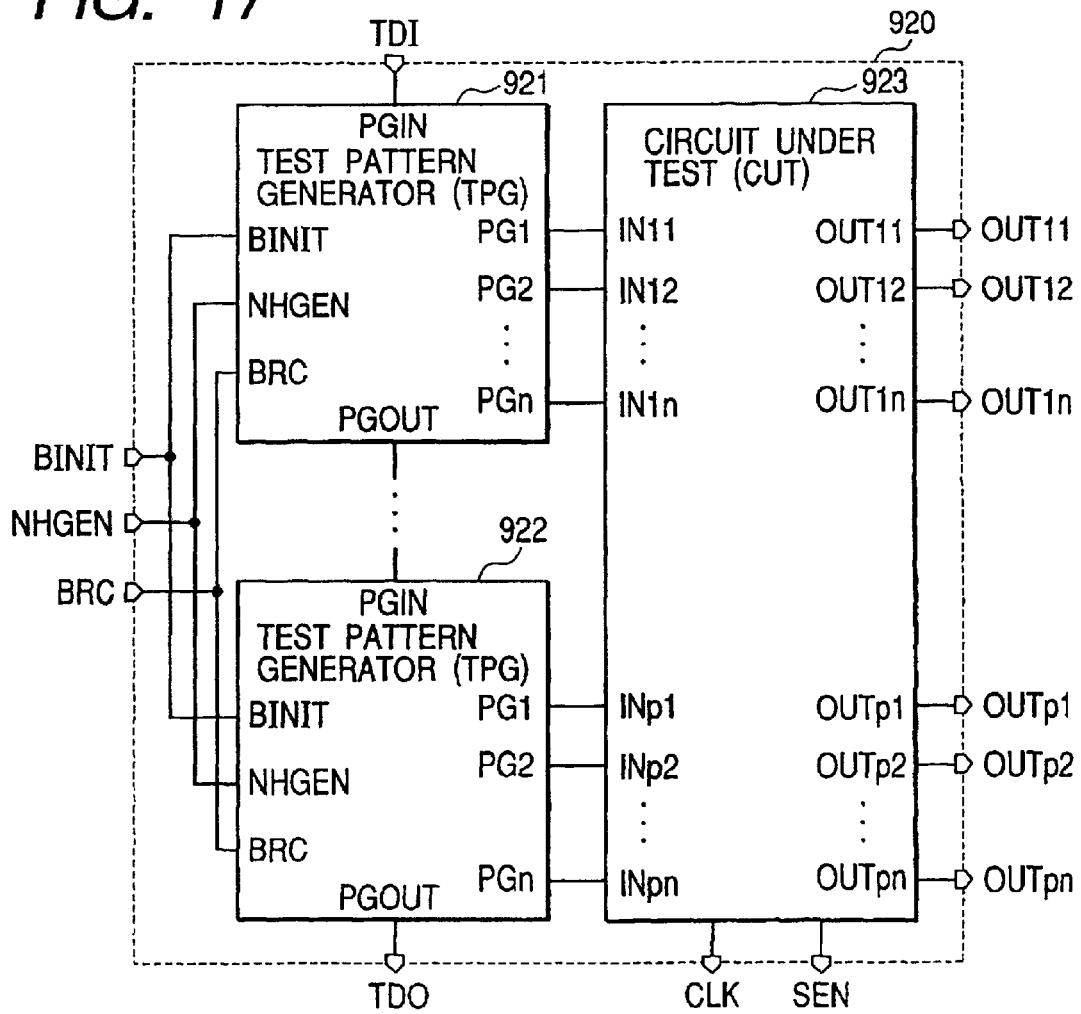
FIG. 17 shows the structure of a semiconductor integrated circuit (test pattern generator) having a test pattern generator according to a third embodiment of this invention.

FIG. 17 shows the structure of a third embodiment of a semiconductor integrated circuit having a test pattern generator according to this invention. The semiconductor integrated circuit 920 is composed of plural test pattern generators 921 to 922 and a circuit under test (CUT) 923. Each of the test pattern generators 921 to 922 has the same structure as the test pattern generator 800, where any combination of the relevant circuits may be used for the identical pattern sequence generator 810 and the bit-flipping sequence generator 820. The circuit under test 923 may be either CUT 200 shown in FIG. 2(a) or CUT 260 as shown in FIG. 2(c). This embodiment offers not only the advantage of achieving a high fault coverage with a smaller volume of test data, but also another advantage that the overhead relating to wirings for scan chains in the CUT can be reduced by distribution of smaller size test pattern generators within the semiconductor integrated circuit.

Figure 18:
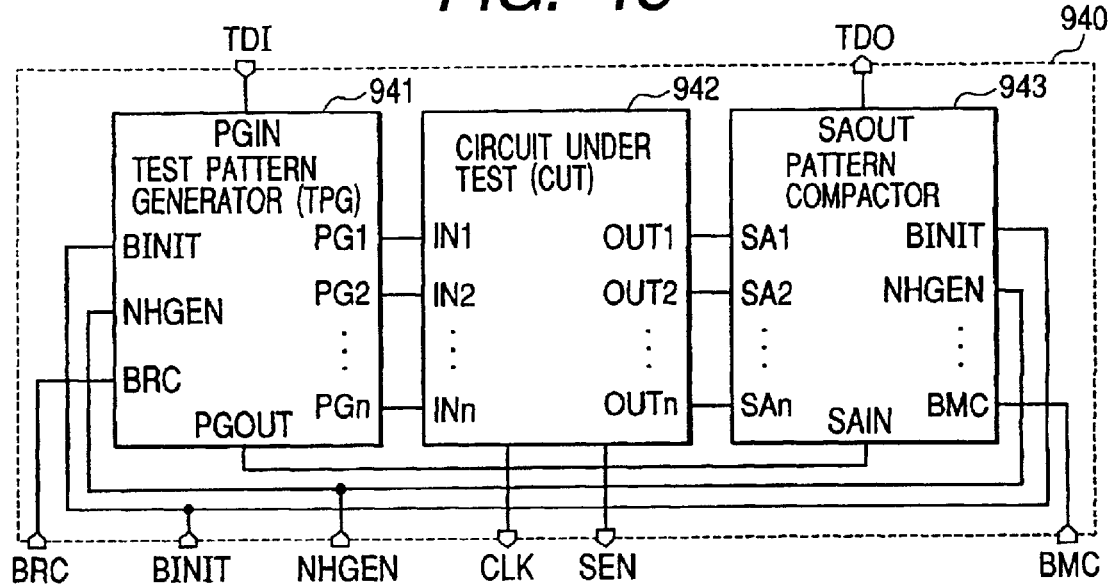
FIG. 18 shows the structure of a semiconductor integrated circuit (test pattern generator) having a test pattern generator according to a fourth embodiment of this invention.

FIG. 18 shows the structure of a fourth embodiment of a semiconductor integrated circuit having a test pattern generator according to this invention. The semiconductor integrated circuit 940 is composed of a test pattern generator 941, a circuit under test (CUT) 942 and a pattern compactor 943. This embodiment is a standard configuration based on BIST according to this invention. The test pattern generator 941 has the same structure as the test pattern generator 800, where any combination of the relevant circuits may be used for the identical pattern sequence generator 810 and the bit-flipping sequence generator 820. The circuit under test 942 has the same structure as the full scan design CUT 200 shown in FIG. 2(a).

Figure 19:
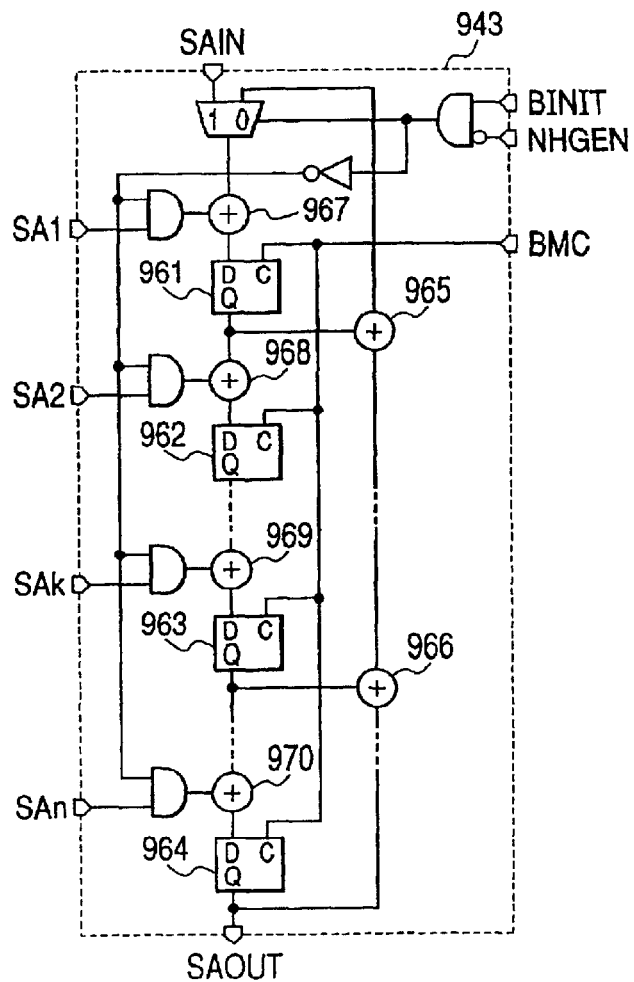
FIG. 19 is a circuit diagram for the pattern compactor shown in FIG. 18.

FIG. 19 shows the circuit of the pattern compactor as shown in FIG. 18. The circuit 960 of the pattern compactor 943 has the same structure as a multiple input signature register (MISR) which is commonly used in the BIST method. In the MISR structure, storage elements 961 to 964, exclusive OR elements 965 and 966 and their feedback constitute LFSR, where exclusive ORs of inputs SA1, SA2, . . . SAn are calculated by exclusive OR elements 967 to 980 just before storage elements 961 to 964. Pattern sequences from inputs SA1, SA2, . . . SAn are encoded (compacted) onto storage elements 961 to 964 synchronously with clock BMC. If the polynomial in the residue system of 2 is a primitive polynomial, the probability of error detection failure (last storage elements 961 to 964 do not have errors in the bit strings though input pattern sequences have errors) is known to be very low. This implies that comparison of the result of reading against the expected final state of MISR brings about the same fault detection effect as comparison of each pattern against the expected pattern. Therefore, the circuit shown in FIG. 19 will achieve a high fault coverage with a volume of test data which is far smaller than in the above-mentioned case.

Figure 20:
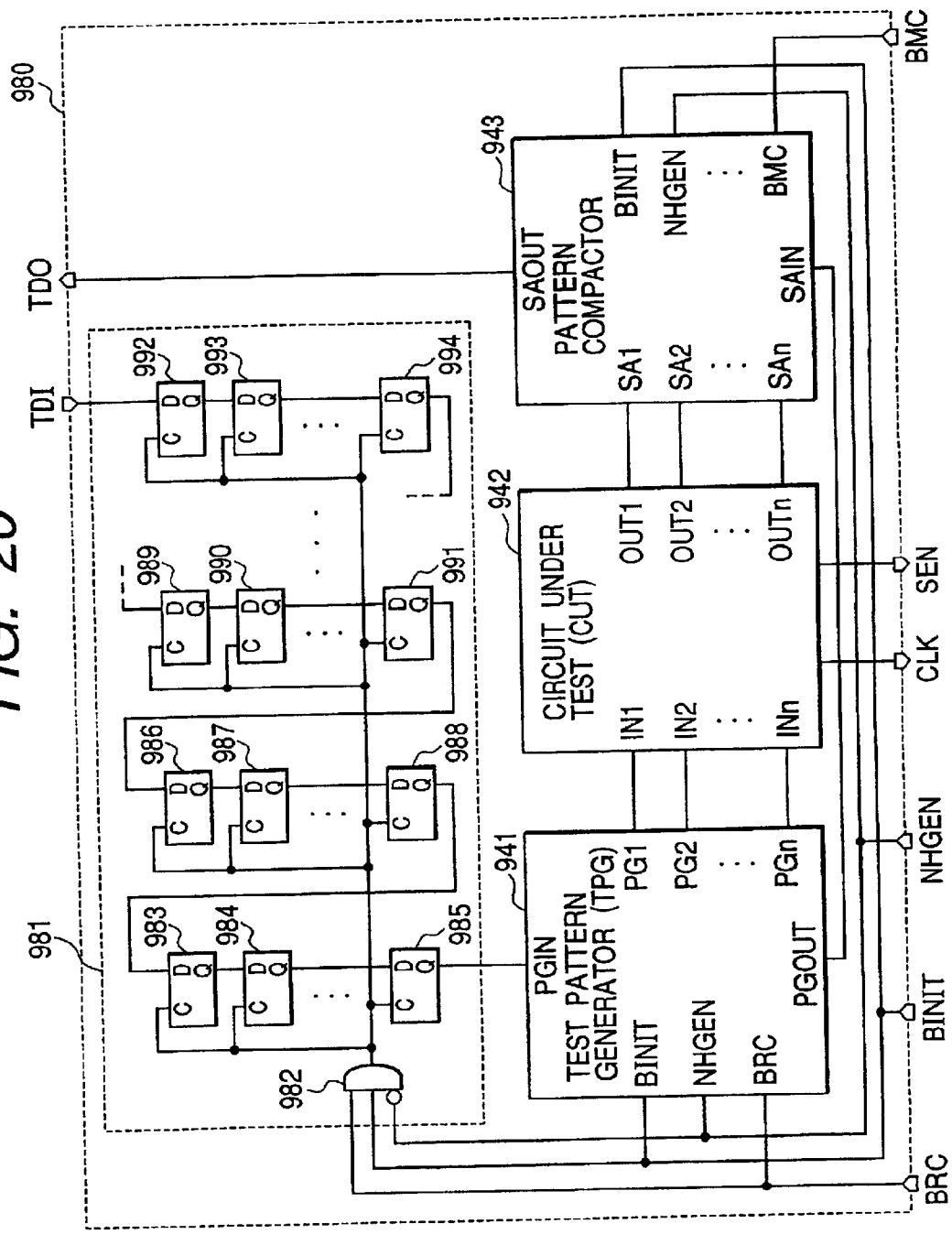
FIG. 20 shows the structure of a semiconductor integrated circuit (test pattern generator) having a test pattern generator according to a fifth embodiment of this invention.

FIG. 20 shows the structure of a fifth embodiment of a semiconductor integrated circuit having a test pattern generator according to this invention. The semiconductor integrated circuit 980 is composed of a seed stored register 981, a test pattern generator 941, a circuit under test (CUT) 942 and a pattern compactor 943. The difference from the semiconductor integrated circuit 940 as the fourth embodiment is that the seed stored register 981 is added between input TDI and the test pattern generator 941 (the same components as those used in the semiconductor integrated circuit 940 are marked with the same reference numerals). The seed stored register 981 works as a shift register synchronously with clock BRC in the initialization mode, or when input BINT is 1 and input NHGEN is 0. The number of storage elements 983 to 985 is the same as the number of storage elements in the pattern compactor 943. The storage elements 983 to 985 store the initial value (seed) for the pattern compactor 943. The number of storage elements 986 to 988, that of 989 to 991, and that of 992 to 994 are the same as the number of storage elements in the test pattern generator 941, and storage elements 986 to 988, 989 to 991 and 992 to 994 store the first, second and s-th initial values for the test pattern generator 941, respectively (s denotes the number of pattern sequence clusters). In the fourth embodiment, since the initial value for the test pattern generator 941 is given with regard to each pattern sequence cluster from the semiconductor integrated circuit test device, there remains the problem of overhead relating to interfacing with the test device. On the other hand, in the fifth embodiment, since the initial values for the test pattern generator 941 with regard to a plurality of pattern sequence clusters can be stored initially, the overhead relating to interfacing with the test device is reduced.

In the above-said first to fifth embodiments, each semiconductor integrated circuit incorporates an identical pattern sequence generator 110 and a bit-flipping sequence generator 120 according to the invention. These may be separated from the CUT and configured as an independent semiconductor integrated circuit test device. Also, the above-said test device may incorporate an identical pattern sequence generator 110, and the semiconductor integrated circuit to be tested may incorporate a bit-flipping sequence generator 120. Also, the invention is effective even when the identical pattern sequence generator 110 and the bit-flipping sequence generator 120 are built on the wafer area other than the semiconductor integrated circuit area to make up an on-wafer semiconductor integrated circuit test device.

Next, how the semiconductor integrated circuit with a test pattern generator according to this invention operates will be described by reference to the timing diagrams.

Figure 21:
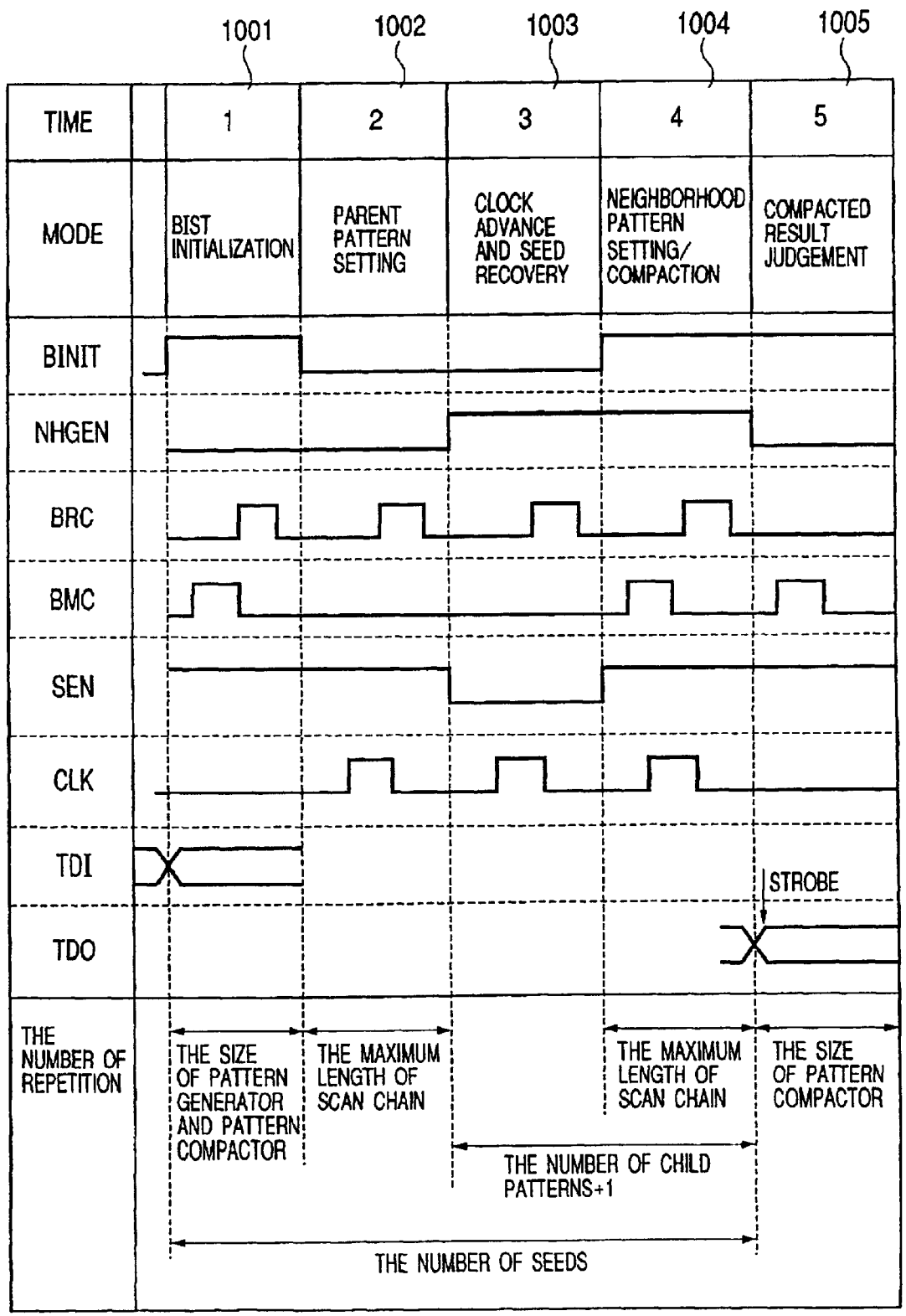
FIG. 21 is a timing diagram for the basic operation of the semiconductor integrated circuit as shown in FIG. 18.

FIG. 21 is a timing diagram illustrating the basic operation of the semiconductor integrated circuit 940 shown in FIG. 18. First, in the BIST initialization mode 1001, the pattern generating controller 830 in the test pattern generator 941 (equal to 800 in FIG. 5) is set to the initialization mode 841; as many pulses as storage elements in the test pattern generator 941 and pattern compactor 943 are alternately given to clock BMC and clock BRC; then the initial values of the test pattern generator 941 and pattern compactor 943 including seeds are inputted through TDI sequentially.

In the parent pattern setting mode 1002, the pattern generating controller 830 in the test pattern generator 941 is set to the pattern generation mode 842; scan enable SEN is set to logical value 1; and pulses are given to scan chain shift clock CLK and clock BRC alternately by the amount equivalent to the maximum length of scan chain so that every storage element in the CUT 942 has a logical value to produce a parent pattern for testing the CUT 942.

In the clock advance and seed recovery mode 1003, the pattern generating controller 830 in the test pattern generator 941 is set to the seed recovery mode 843; scan enable SEN is set to logical value 0; and a pulse is given once to each of clock CLH for capturing data and seed recovery clock BRC.

In the neighborhood pattern setting/compaction mode 1004, the pattern generating controller 830 in the test pattern generator 941 is set to the neighborhood pattern generation mode 844; scan enable SEN is set to logical value 1; and pulses are given to scan chain shift clock CLK and clock BRC sequentially by the amount equivalent to the maximum length of scan chain so that compaction of result of clock advance and setting of the next child pattern take place simultaneously. Then, modes 1003 and 1004 are repeated, with the number of repetitions being 1 (parent pattern) plus the number of child patterns or so. Through the steps from mode 1001 to mode 1004, the test pattern generator 941 generates one pattern sequence cluster to test the CUT 942 with one parent pattern and child patterns, and the resultant response pattern is compacted into the last state of the pattern compactor 943 (value of all storage elements).

The sequence from mode 1001 to mode 1004 is repeated almost as many times as seeds or pattern sequence clusters. In the BIST initialization mode 1001 during the second and subsequent cycles, at the same time when the test pattern generator 941 and the pattern compactor 943 are initialized, the last state of the pattern compactor 943 as the compacted result of the pattern of response to the test is also read out. In the last cycle of the above sequence, the last state of the pattern compactor 943 is read out in the compacted result judgment mode 1005.

Here, what kind of patterns can be used to test the CUT 942 is explained, referring to FIG. 18 (semiconductor integrated circuit 940) and the timing diagram in FIG. 20. For better illustration, it is assumed that the length of scan chain for the full scan design CUT 942 is 259 and the number of scan chains is n. Thus, the number of patterns in a pattern sequence generated by the test pattern generator 941 is 259. Referring to FIGS. 24 to 27, an explanation will be given below for each of the bit-flipping controllers shown in FIGS. 10 to 13, concerning how variations of a reference pattern sequence or child patterns from the parent pattern can be generated in a pattern sequence cluster by scanning.

FIGS. 24 to 27 outline the CUT 200 as shown in FIG. 2(a), where each square represents a scan flip-flop and a hatched square represents a flipped bit with respect to the parent pattern. The number of a child pattern denotes the value on the counter for pattern sequence number at the time of generation of the child pattern.

Figure 24:
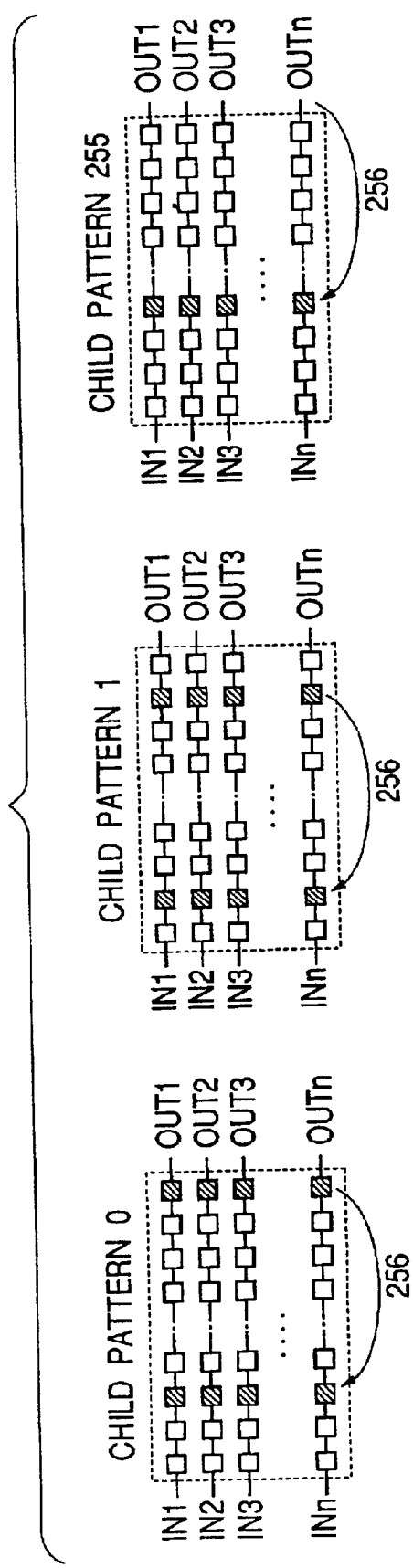
FIG. 24 illustrates child patterns in case of using the bit-flipping controller as shown in FIG. 10.

FIG. 24 illustrates 256 child patterns in case of using the bit-flipping controller 600. Child patterns 0 to 2 are patterns which include two columns of flipped bits on a cycle of 256 (bits), while child patterns 3 to 255 are patterns which include one column of flipped bits.

Figure 25:
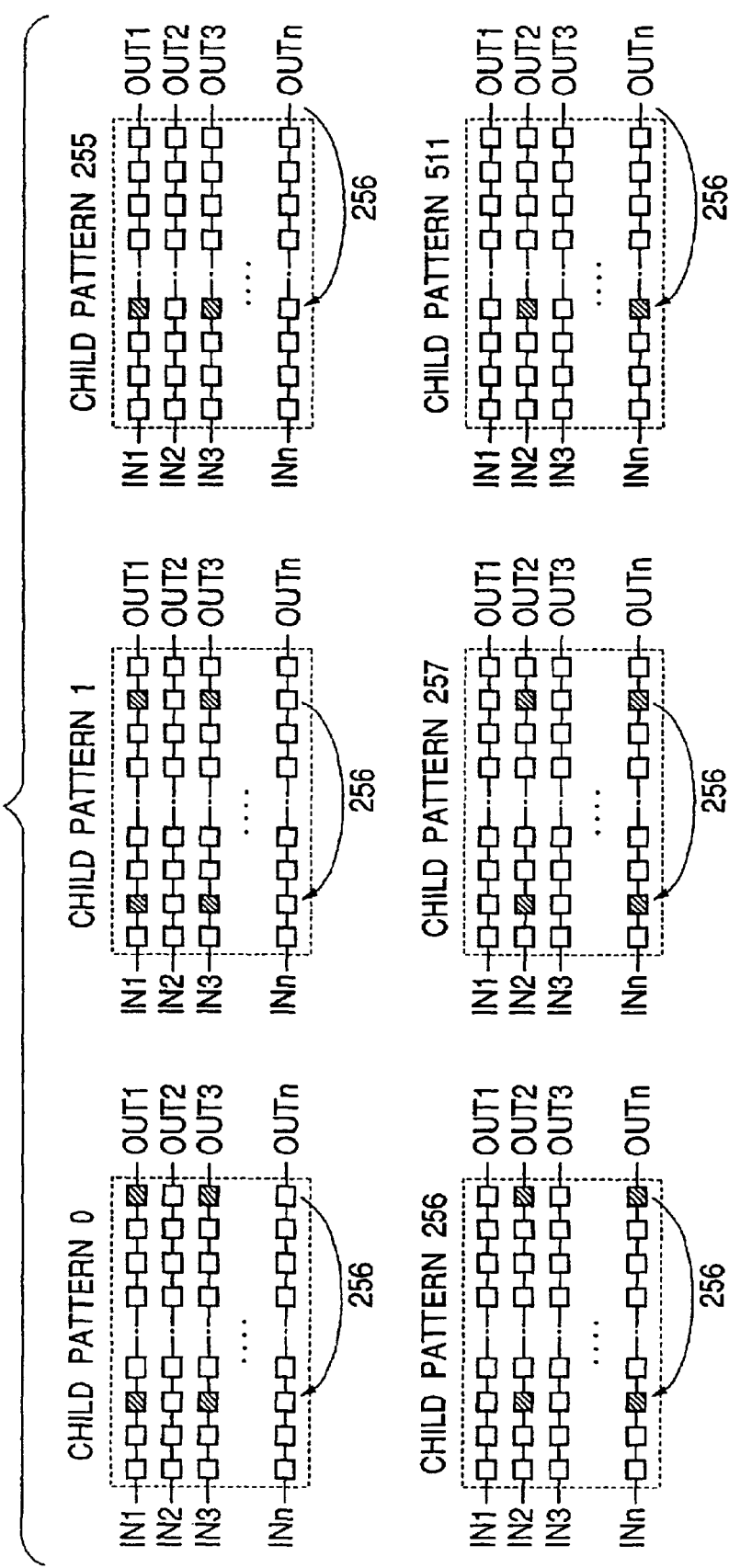
FIG. 25 illustrates child patterns in case of using the bit-flipping controller as shown in FIG. 11.

FIG. 25 illustrates 512 child patterns in case of using the bit-flipping controller 620. The columns having flipped bits in child patterns 0 to 255 and 256 to 511, correspond to the columns of flipped bits in the child patterns in FIG. 24. In this case, however, such columns in child patterns 0 to 255 have flipped bits in odd-numbered rows (storage elements on a scan chain of IN1, IN3 and so on) and those in child patterns 256 to 511 in even-numbered rows (storage elements on a scan chain of IN2, IN4 and so on).

Figure 26:
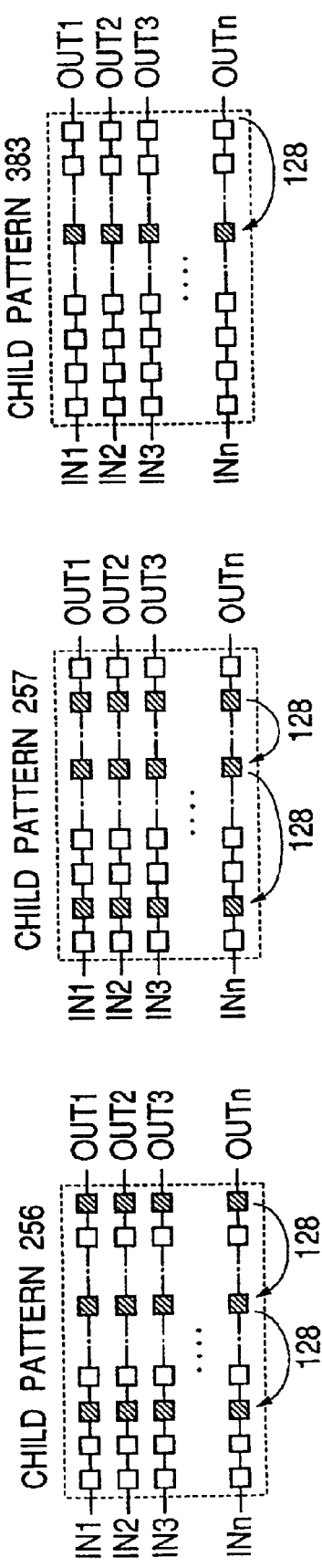
FIG. 26 illustrates child patterns in case of using the bit-flipping controller as shown in FIG. 12.

FIG. 26 illustrates child patterns 256 to 384 in case of using the bit-flipping controller 640. Here, child patterns 0 to 255 are omitted because they are identical to the ones in FIG. 24. Child patterns 256 to 258 are patterns which include three columns of flipped bits on a cycle of 128, while child patterns 259 to 383 are patterns which include two columns of flipped bits on a cycle of 128 bits.

Figure 27:
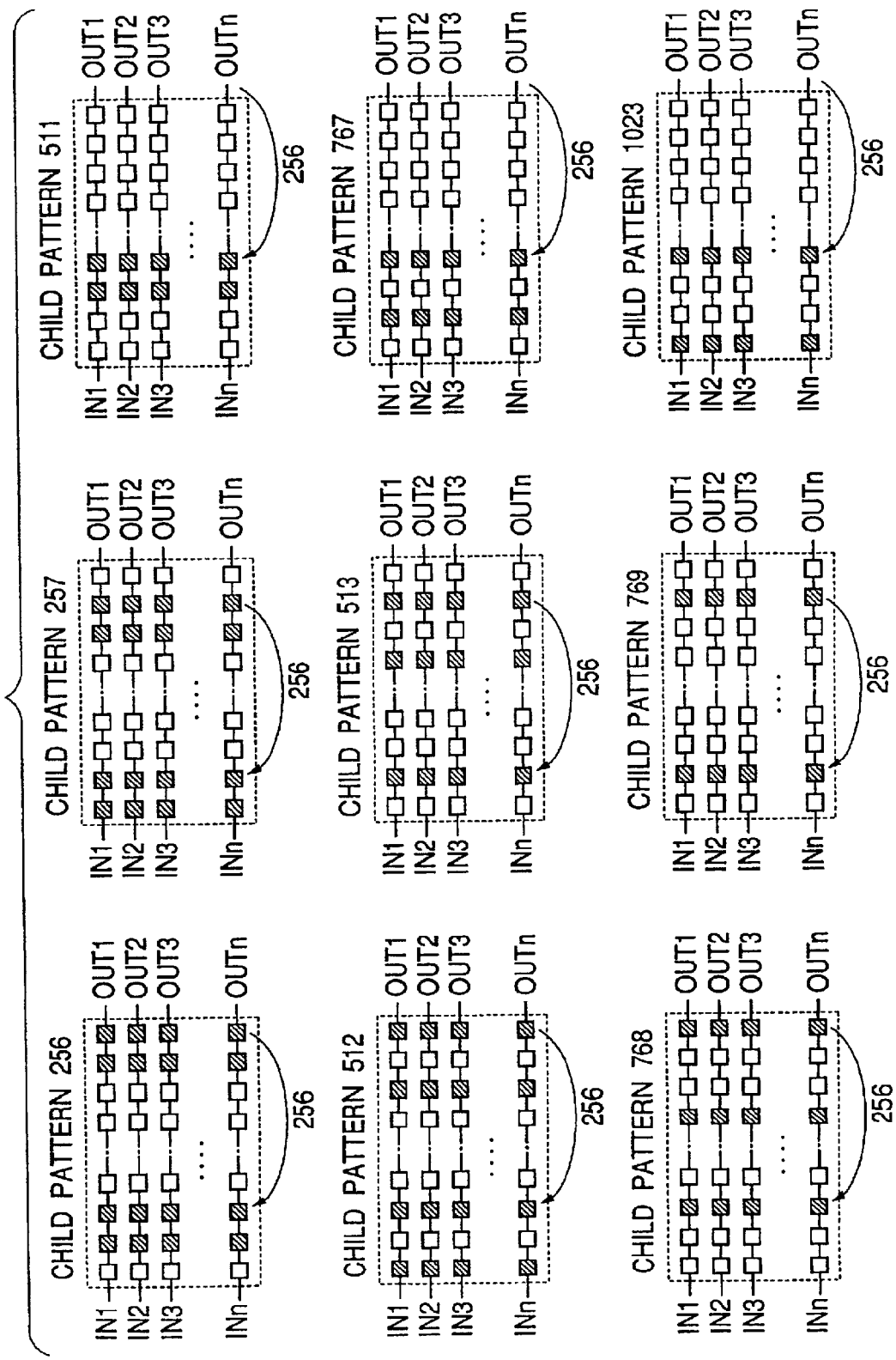
FIG. 27 illustrates child patterns in case of using the bit-flipping controller as shown in FIG. 13.

FIG. 27 illustrates child patterns 256 to 1023 among 1024 child patterns in case of using the bit-flipping controller 660.

Here, child patterns 0 to 255 are omitted because they are identical to the ones in FIG. 24. Child patterns 256 to 511 are patterns which include two consecutive columns of flipped bits on a cycle of 256; child patterns 256 and 257 have a total of four such columns; child pattern 258 has a total of three; child patterns 259 to 511 have two. Child patterns 512 to 767 have two columns of flipped bits on a cycle of 256 with one non-flipped bit column between them; child pattern 512 has a total of four columns of flipped bits, child patterns 513 and 514 a total of three, and child patterns 515 to 767 a total of two. Child patterns 768 to 1023 have two columns of flipped bits have two columns of flipped bits on a cycle of 256 with two non-flipped bit columns between them; child patterns 768 to 770 have a total of three columns of flipped bits, and child patterns 771 to 1023 a total of two.

FIG. 28 shows the structure of a sixth embodiment of a semiconductor integrated circuit having a test pattern generator according to this invention. The semiconductor integrated circuit 1200 is composed of a test pattern generator 1210 and a circuit under test (CUT) 1220. The CUT 1220 has eight storage elements 1221 to 1228, an AND element 1229 which uses their outputs x1 to x8 as input, and a storage element 1230 which uses output x0 of the AND element 1229 as input and output y0 of the storage element 1230 is added to inputs D of storage elements 1221 to 1228.

The CUT 1220 is a full scan design circuit, in which the storage element 1230 is on scan chain 1231 and storage elements 1221 to 1228 are on scan chain 1232. The test pattern generator 1210 has the same structure as the test pattern generator 800 in FIG. 15. It generates a pattern with four bits: outputs PG1, PG2, PG3 and PG4. The identical pattern sequence generator 810 has the same structure as the identical pattern sequence generator 440 in FIG. 6. The bit-flipping controller 821 has the same structure as the bit-flipping controller 600 in FIG. 10, where the number of bits for both the counters 601 and 602 is 3.

Figures 28A, 28B:
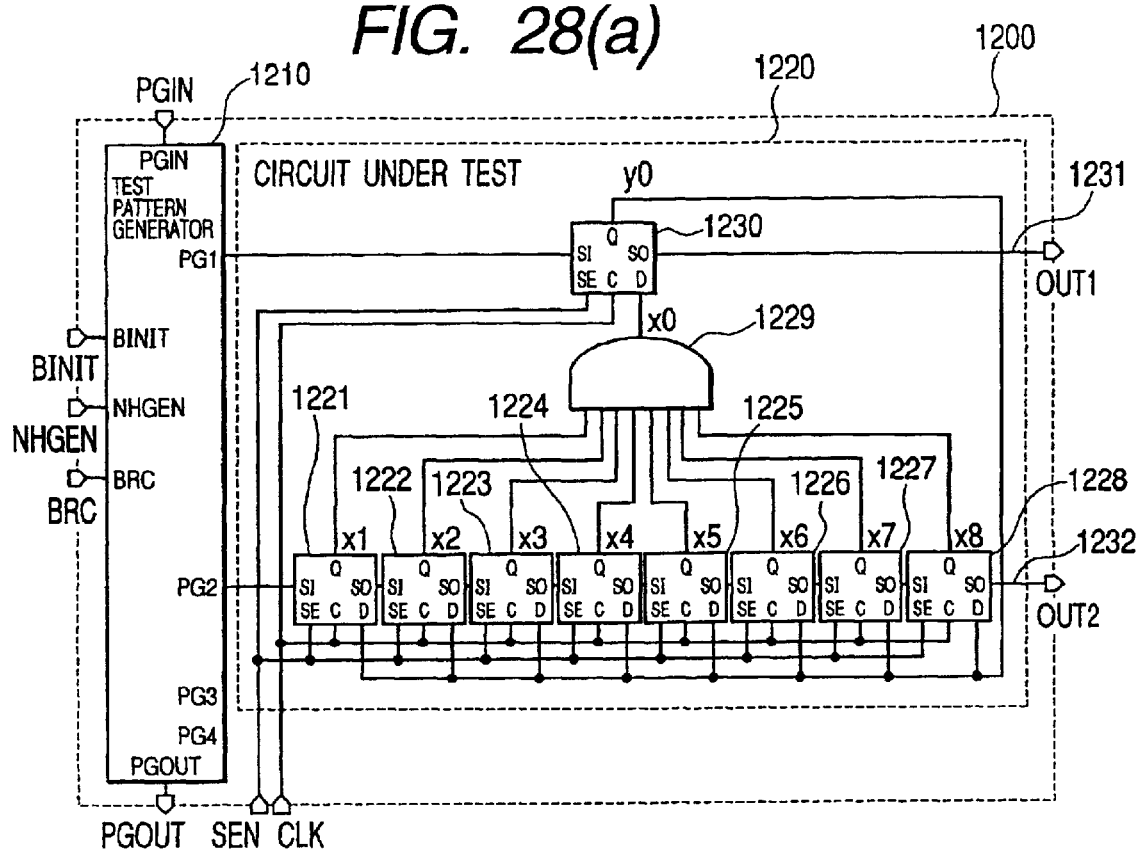

FIG. 28(b) illustrates a test pattern set when 0 stuck-at fault and 1 stuck-at fault are assumed for storage element outputs x0, x1, . . . x8, y0 in the CUT 1220. Column 1241 represents each test pattern number, column 1242 each test pattern as expressed by a set of logical values for storage element output names, and column 1243 detectable stuck-at fault as expressed by "signal line name/stuck value." In column 1242, X represents an indefinite value, whether it is logical value 0 or 1.

The nature of the test pattern set as given in FIG. 28(b) is as follows. Patterns of pattern Nos. 2 to 9 are patterns which include one flipped bit with respect to No. 1 pattern all of which bits have logical value 1. In other words, neighborhood patterns whose Hamming distance from No. 1 pattern is 1 can detect virtually all faults. The paper by K. H. Tsai et al as discussed earlier points out that neighborhood patterns are valid as test patterns for many circuits.

FIG. 29 is a table explaining details of operation of the semiconductor integrated circuit 1200 during testing. A timing diagram showing the operation should be the same as the one shown in FIG. 21 except that, due to the non-existence of a pattern compactor, clock BMC does not exist. "P" in the table means that a pulse is given to clock. For initialization of the test pattern generator, the feedback enable storage element is set to 0, LFSR seed to (1, 1, 1, 1) and the 3-bit counter for pattern sequence number to 7. The 3-bit counter for time in pattern sequence need not be initialized because it is reset to zero at every appearance of a child pattern.

Times 1 to 11 are for initialization of the test pattern generator; the above-said initialization is completed at time 11. Times 12 to 19 are for setting a parent pattern by scan shift, where the parent pattern is set on storage elements y0, x1, . . . x8 at time 19. At time 20, the result of response to the parent pattern is stored into y0 and x1, . . . x8 by clock advance. At times 21 to 28, the result of response to the parent pattern is read through external output terminals O1 and O2 by scan shift and at the same time, child pattern 0 (only x8 is flipped to 0) is set on storage elements x0, x1, . . . x8 at time 28. Clock advance and child pattern setting/result reading are repeated in this way. At time 91, child pattern 7 is set on storage elements y0, x1, . . . x8; and at time 92, response pattern is stored in y0, x1, . . . x8 by clock advance. Lastly, at times 93 to 100, the pattern of response to child pattern 7 is read.

The test patterns which are realized by the above sequence can cover all the test patterns as given in FIG. 28(b). Specifically, the parent pattern covers pattern No. 1 and pattern No. 10; child pattern 0 covers pattern No. 2 and pattern No. 10; child pattern 1 covers pattern No. 3 and pattern No. 10; child pattern 2 covers pattern No. 4 and pattern No. 10; child pattern 3 covers pattern No. 5 and pattern No. 10; child pattern 4 covers pattern No. 6 and pattern No. 10; child pattern 5 covers pattern No. 7 and pattern No. 10; child pattern 6 covers pattern No. 8 and pattern No. 10; child pattern 7 covers pattern No. 9 and pattern No. 11.

Therefore, the volume of test data required to test for all stuck-at faults in the semiconductor integrated circuit 1200 corresponds to the initial value for the test pattern generator 1210, 1 seed or 10 bits (including the counter initial value). If the CUT 1220 is to be tested for all stuck-at faults by the stored test method, the required test data volume corresponds to eleven patterns or a total of 74 bits. It is, therefore, obvious that the semiconductor integrated circuit according to this invention can remarkably reduce the required data volume for testing.

From now on, an explanation will be made in connection with timing diagrams for pseudo-random pattern generation and relevant complicated timing diagrams and test patterns.

Figure 22:
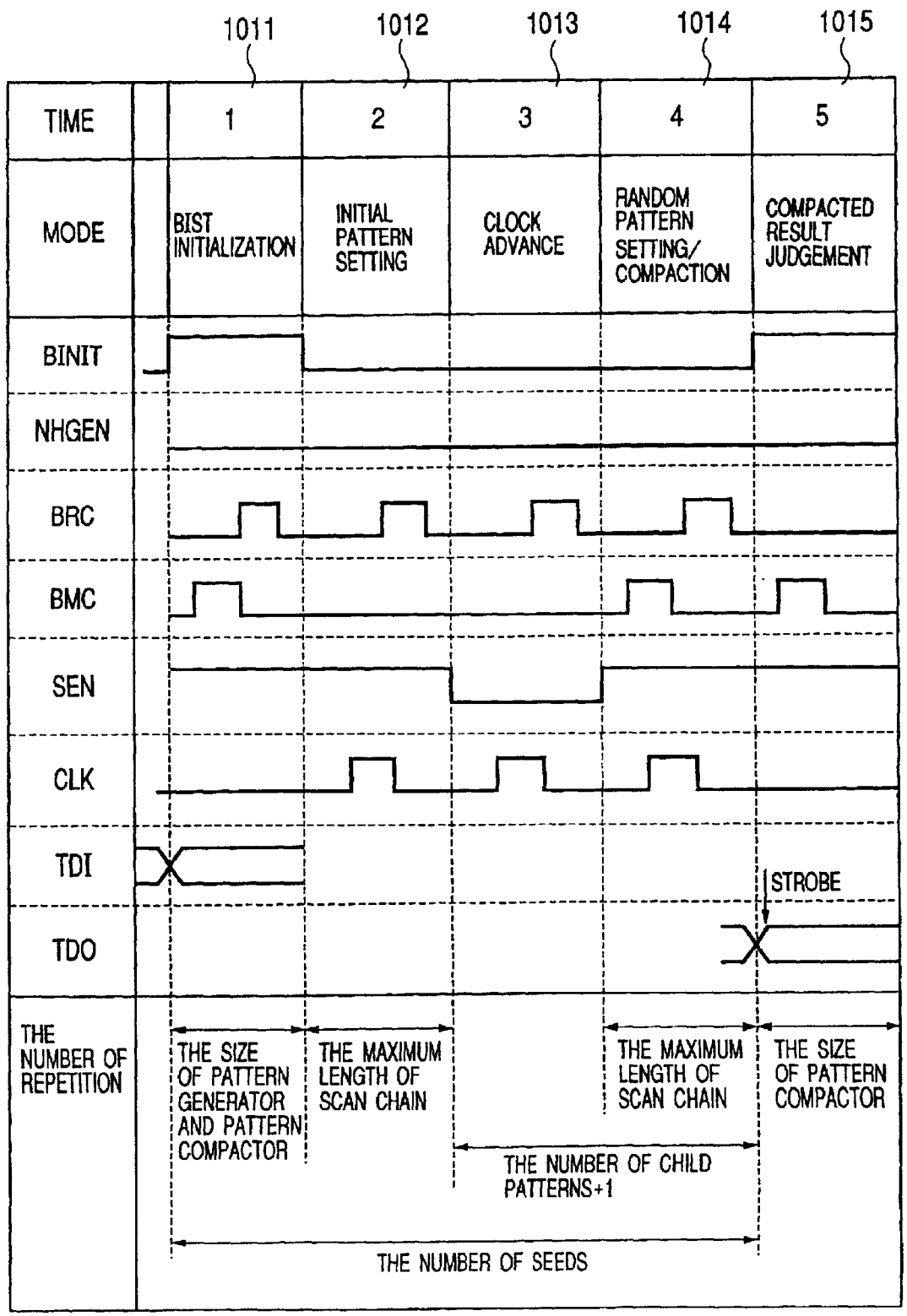
FIG. 22 is a timing diagram for generation of pseudo-random patterns in the semiconductor integrated circuit as shown in FIG. 18.

FIG. 22 is a timing diagram for generation of pseudo-random patterns similar to ones generated by a conventional LFSR, in the semiconductor integrated circuit 940 shown in FIG. 18. The BIST initialization mode 1011 and the initial pattern setting mode 1012 are the same as modes 1001 and 1002 in FIG. 21, respectively. In the clock advance mode 1013 and the random pattern setting/compaction mode 1014, the same settings as those for the pattern generation mode 842 (FIG. 15(b)) are made. Here, since each of the identical pattern sequence generators 400 (FIG. 4), 420 (FIG. 5), 440 (FIG. 6) and 460 (FIG. 7) works in the same way as LFSR itself, their output patterns are pseudo-random patterns. The last step, or compacted result judgment mode 1015, is the same as mode 1005 in FIG. 21.

Figure 23:
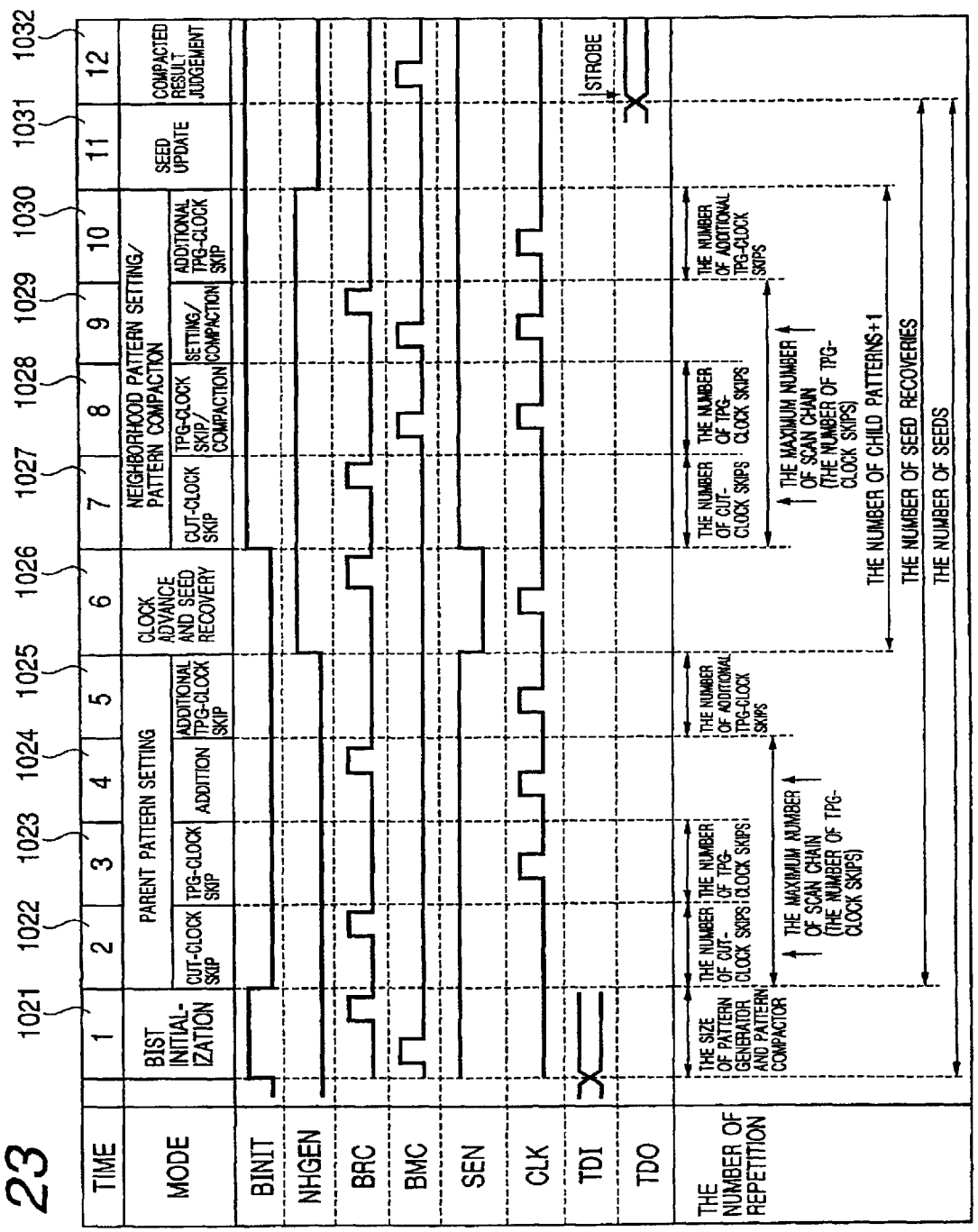
FIG. 23 is a timing diagram for generation of pseudo-random patterns in the semiconductor integrated circuit as shown in FIG. 18.

FIG. 23 is an example of a complicated timing diagram for the semiconductor integrated circuit 940 in FIG. 18. In comparison with the timing diagram in FIG. 21, the parent pattern setting mode (1022 to 1025) and the neighborhood pattern setting/pattern compaction mode (1027 to 1030) are complicated and a seed update mode 1031 is newly added in this timing diagram for the circuit in FIG. 18. Only the points which are different from the diagram in FIG. 21 are described below.

At the step of CUT-clock skip 1022 in the parent pattern setting mode, pulses are given only to clock BRC, so the state of LFSR only changes but no scan chain shift occurs. This is repeated the number of times equal to a specified number of CUT-clock skips. At TPG-clock skip 1023 (TPG: test pattern generator), pulses are given only to clock CLK, so only scan chain shift occurs but LFSR remains unchanged. This is repeated the number of times equal to a specified number of TPG-clock skips. At step 1024, pulses are given alternately to clock CLK and clock BRC, so scan chain shift occurs and the state of LFSR changes as well. These modes 1022 to 1024 are repeated until a logical value is set on every storage element in the CUT 942. After that, at the step of additional TPG-clock skip 1025, pulses are given only to clock CLK, so only scan chain shift occurs. This is repeated the number of times equal to a specified number of additional TPG-clock skips. The number of CUT-clock skips must be smaller than the number of scan chains; the number of TPG-clock skips must be smaller than the maximum length of scan chain; and the number of additional TPG-clock skips must be smaller than the number of TPG-clock skips.

Furthermore, the neighborhood pattern setting/pattern compaction mode (1027 to 1030) is the same as the parent pattern setting mode (1022 to 1025) except clock BMC which activates the pattern compaction circuit 943. In the seed update mode 1031, the pattern generating controller 830 in the test pattern generator 941 is set to the initialization mode 841 and no pulse is given to clock BRC, so the state of LFSR is copied to the seed backup registers.

Here, the meanings of the terms "CUT-clock skip," "TPG-clock skip," and "seed update" are as follows. "CUT-clock skip" is defined in the gazette incited earlier, J-P-A-No. 170609/1998. For instance, in the case of the semiconductor integrated circuit 940 in FIG. 18, it is assumed that the test pattern generator 941 is the same as the identical pattern sequence generator 440 based on 4-bit LFSR (FIG. 6), the number of scan chains in the CUT 942 is 4, and the length of scan chain is all 5. Under this condition, test patterns set for the CUT 942 and the LFSR state at completion of setting are illustrated in FIGS. 31 and 32. In these figures, only the four bits of LFSR are illustrated on behalf of the section 1401 representing logical values in the test pattern generator 941, where the feedback controller 1402 and seed input 1403 are schematically represented. As for LFSR seeds, s1, s2, s3 and s4 are serially set through seed input 1403; a random number sequence generated after LFSR seed setting is r1, r2, r3 and so on. If the input of the feedback controller 1402 is 0, it follows that r1=s1, r2=s2, r3=s3 and so on. If the input of the feedback controller 1402 is 1, it follows that r1=s1+s4, r2=s2+r1, r3=s3+r2 and so on.

Figure 31A:
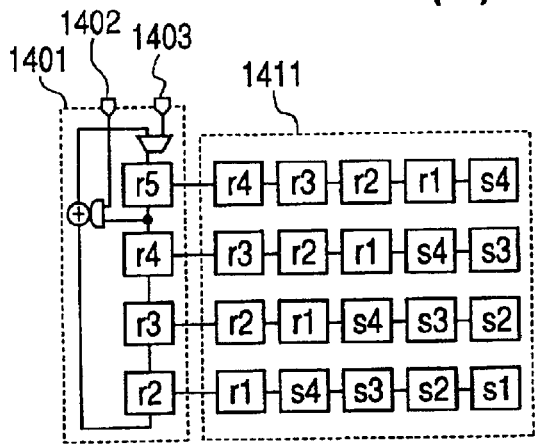
FIGS. 31(a) through (e) are schematic diagrams illustrating how operation differs depending on the pattern generating conditions in the semiconductor integrated circuit according to this invention.
Figure 31B:
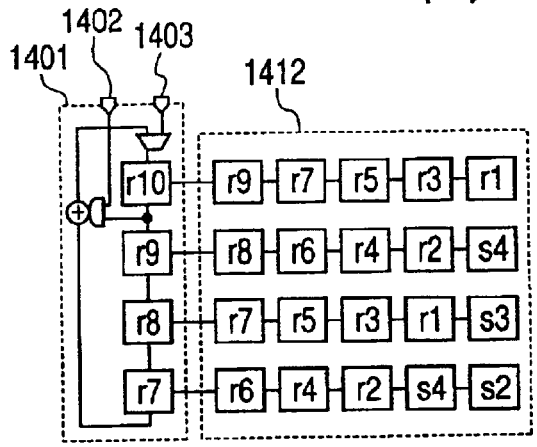
Figure 31C:
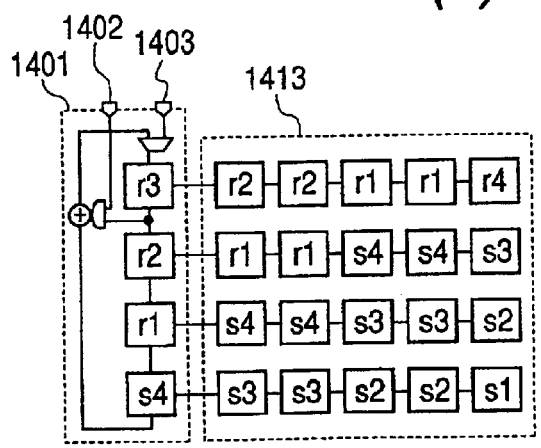
Figure 31D:
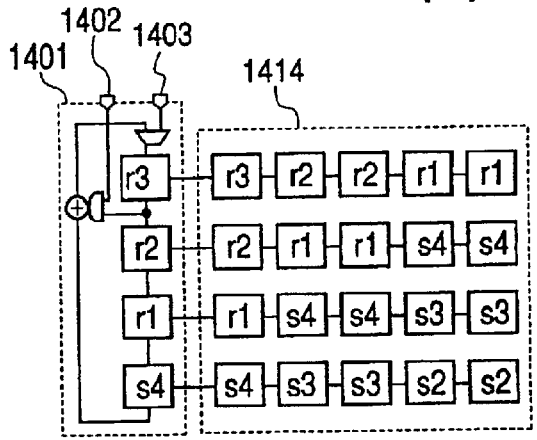
Figure 31E:
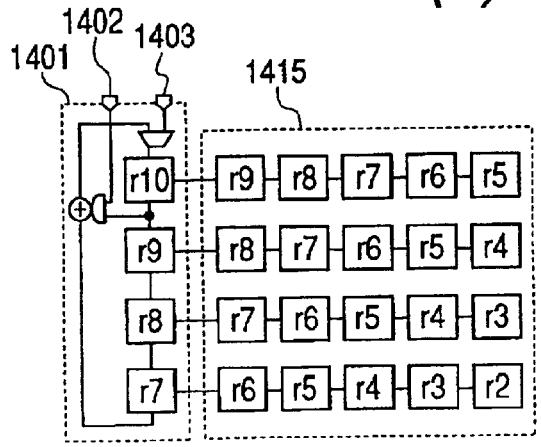
Figure 32A:
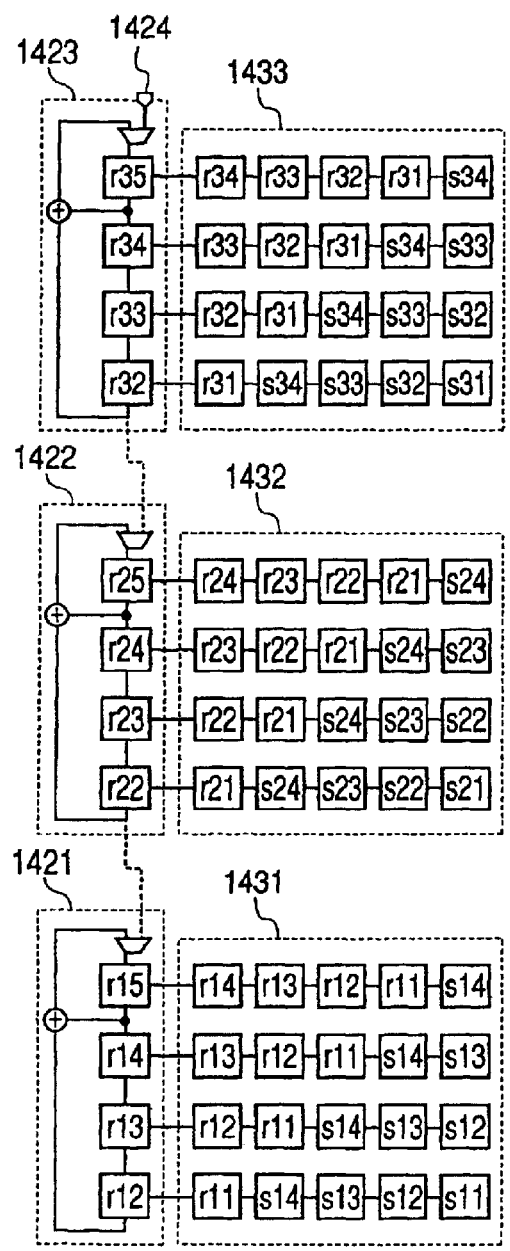
FIGS. 32(a) and (b) are schematic diagrams illustrating how operation differs depending on the pattern generating conditions in the semiconductor integrated circuit according to this invention.
Figure 32B:
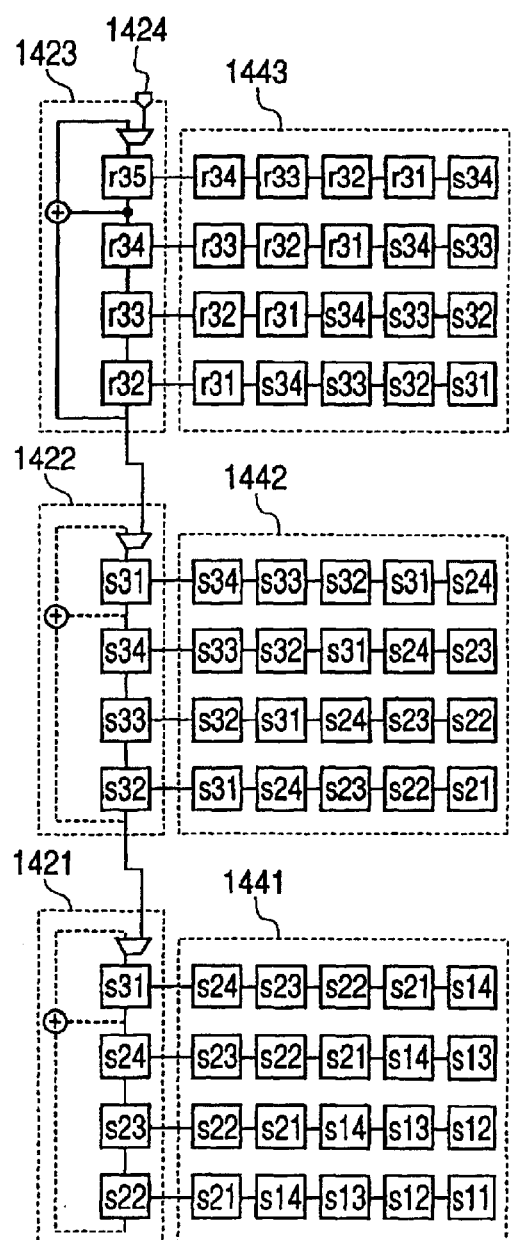

FIG. 31(a) indicates that when the number of CUT-clock skips=1 and the number of TPG-clock skips=0, in the test pattern for the CUT 1411 there is a correlation among storage elements in the direction from right top to left bottom. When the number of CUT-clock skips=0 and the number of TPG-clock skips=0, in the test pattern for the CUT 1411 there is a correlation among storage elements in the direction from right top to left bottom. FIG. 31(b) indicates that when the number of CUT-clock skips=1 and the number of TPG-clock skips=0, in the test pattern for the CUT 1412 there is a correlation among storage elements in the direction from right top to left bottom with one non-correlated row between correlated rows. FIG. 31(c) indicates that when the number of CUT-clock skips=0, the number of TPG-clock skips=1 and the number of additional TPG-clock skips=0, in the test pattern for the CUT 1413 there is a correlation among storage elements in the direction from right top to left bottom with two successive storage elements in the scan chain shift direction having an equal logical value. FIG. 31(d) indicates that when the number of CUT-clock skips=0, the number of TPG-clock skips=1 and the number of additional TPG-clock skips=1, in the test pattern for the CUT 1414 there is a different correlation among storage elements with the patterns being shifted to the right from those for the CUT 1413 by one column. FIG. 31(*e*) indicates that when the number of CUT-clock skips=0 and the number of TPG-clock skips=0 and seeds are updated, the test pattern for the CUT 1415 may be considered as the second pseudo-random pattern generated from LFSR or the test pattern generated when r2, r3, r4, r5 are set as LFSR seed.

As can be understood from the above explanation, "CUT-clock skip" has the effect of improving the fault coverage as it changes the correlation among storage elements in test patterns. "TPG-clock skip" has the effect of suppressing the rate of generation of state change signals during scan chain shift or clock advance, thereby reducing noise in testing. "Additional TPG-clock skip" changes the correlation among storage elements resulting from "TPG-clock skip," thereby improving the fault coverage.

Next, test patterns which are generated when a plurality of test pattern generators are provided as in the semiconductor integrated circuit 920 shown in FIG. 17, and their effect will be described. Each of the test pattern generators 921 to 922 has an identical pattern sequence generator 460 (FIG. 7) which can switch between pseudo-random pattern generation and pattern generation by shift. In the CUT 923, there are 12 scan chains and 4 such chains are connected to each of pattern generators 921 to 922 where the length of scan chain is 5. FIG. 32(*a*) shows the test pattern generated when the storage element 475 in the identical pattern sequence generator 460 is all set to logical value 0. FIG. 32(*b*) shows the test pattern generated when only the storage element 475 in the test pattern generator 1423, a test pattern generator nearest to input TDI for initialization, is set to 0, and the register 475 in the other test pattern generators 1421 and 1422 is set to 1.

The seeds for LFSR in the identical pattern sequence generators 1421, 1422 and 1423 are sequentially set to (s11, s12, s13, s14), (s21, s22, s23, s24), and (s31, s32, s33, s34). The random number sequences generated after LFSR seed setting are sequentially referred to as (r11, r12, r13, . . . ), (r21, r22, r23, . . . ), and (r31, r32, r33, . . . ). These can be formularized by linear equations with regard to (s11, s12, s13, s14), (s21, s22, s23, s24), and (s31, s32, s33, s34), respectively.

To help the reader better understand how easy seed encoding is, a comparison between the case in FIG. 32(*a*) and the one in FIG. 32(*b*) is made below. It is assumed that the set of storage elements to be set for a test pattern are on a scan chain connected to one test pattern generator. Here, while the number of 6 variables in simultaneous linear equations for storage elements 1431, 1432, 1433 and 1443 is 4, the number of variables for storage elements 1441 and 1442 is 8 (variables for storage elements 1441 are s11, s12, s13, s14, s21, s22, s23, s24; variables for storage elements 1442 are s21, s22, s23, s24, s31, s32, s33, s34). The larger the number of variables, the more likely success in seed encoding, so it can be thought that pattern generation by shift as in FIG. 32(*b*) is advantageous for seed encoding. Thus, the identical pattern sequence generator 460, which can switch between pseudo-random pattern generation and pattern generation by shift, increases the possibility of successful seed encoding in case of existence of plural pattern generation stages.

Explained below by example are the procedures for extracting information necessary for testing a semiconductor integrated circuit according to this invention, particularly the procedures for determining pattern sequences in the identical pattern sequence generator 110.

The explanation assumes that the identical pattern sequence generator 110 is LFSR-based like other identical pattern sequence generators 400, 420, 440 and 460, and the CUT is a full scan design circuit like the CUT 200.

The testing procedure is assumed as follows: for achieving virtually 100% fault coverage efficiently, testing with a given number of patterns (BIST) is first made in the random pattern setting/compaction mode 1014 shown in FIG. 22; then the neighborhood pattern setting/compaction mode 1004 shown in FIG. 21 is executed before testing by the stored test method is lastly conducted to compensate for imperfection in fault coverage by the BIST method. This means that the required information is a seed set for use in the identical pattern sequence generator and an additional test pattern set to compensate for imperfection in fault coverage. Elements in the seed set are test pattern generator initial values and such initial values include the number of CUT-clock skips, the number of TPG-clock skips, the number of additional TPG-clock skips, LFSR polynomial selection and pattern sequence number counter initial values, in addition to LFSR seeds.

Figure 33:
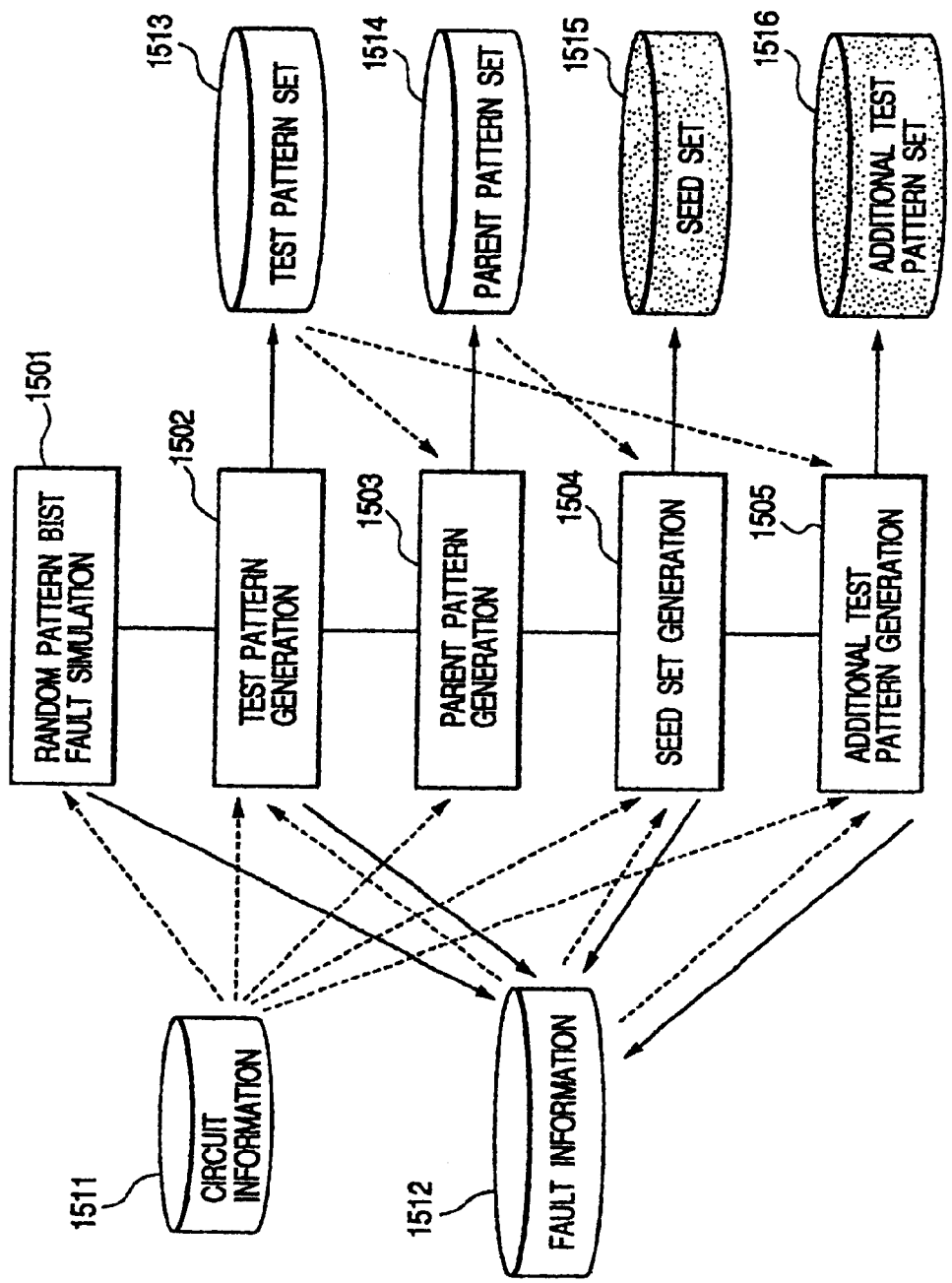
FIG. 33 is a flow chart illustrating one embodiment of a method for extracting necessary data for semiconductor integrated circuit testing according to this invention.

The procedure for obtaining the seed set and additional test pattern set is outlined in FIG. 33. At step 1501, calculation of the expected pattern in the BIST random pattern mode and fault simulation are carried out to output fault information 1512. At step 1502, test pattern generation or redundancy judgment are made on undetected faults known from the fault information 1512 to output a test pattern set 1513 and make the result of the redundancy judgment reflect in the fault information 1512. At step 1503, the test pattern set 1513 is used to generate a parent pattern as a central pattern among neighborhood patterns and output a parent pattern set 1514. At step 1504, the parent pattern set 1514 is converted into a seed set 1515 as information which enables the BIST neighborhood pattern generation mode, and calculation of relevant expected pattern and fault simulation are performed to update the fault information 1512. At step 1505, the test pattern necessary for compensating for imperfection in fault coverage is extracted from the test pattern set 1513 and fault information 1512 to output an additional test pattern set 1516 and update the fault information 1512.

In test pattern generation at step 1502, each pattern should be generated in a way that the values of storage elements which need not be set are indefinite, as far as possible, in order to make the pattern cluster in parent pattern generation at step 1503 (stated later) effective. For instance, it is recommended that the following sequence be repeated: a test pattern for a fault is generated using an existing test pattern generation algorithm and fault simulation is performed while the values of storage elements which need not be set remain indefinite, to detect a fault at the same time. It is, however, advisable to avoid what is called "test pattern compaction," or merging parts of indefinite values in generated patterns.

Figure 34:
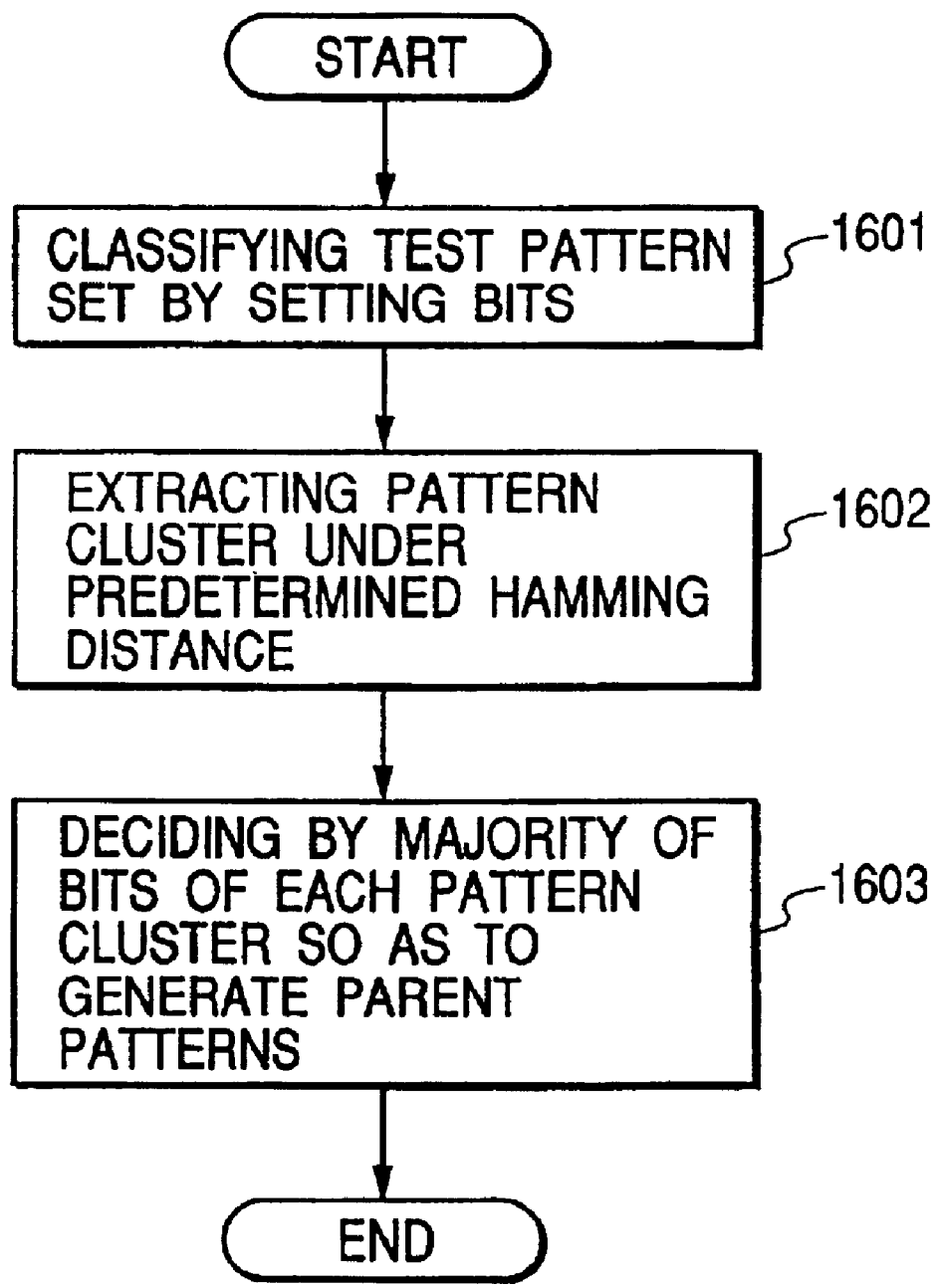
FIG. 34 is a flow chart illustrating the detailed sequence for parent pattern generation as shown in FIG. 33.

FIG. 34 shows the procedure for parent pattern generation 1503 in FIG. 33. At step 1701, the test pattern set is classified into pattern groups in each of which patterns are identical in the set of storage elements whose logical value 0 or 1. At step 1702, the pattern groups classified at step 1701 are further classified into pattern subgroups so that the Hamming distance for test patterns within each subgroup is under the Hamming distance which depends on the functionality of the bit-flipping controller 121. For instance, in bit-flipping controllers 600 and 620, the Hamming distance should be under 1, and in bit-flipping controllers 640 and 660, it should be under 2. Each of test pattern groups thus generated is called a pattern cluster. At step 1703, a pattern decided by majority of bits for each pattern cluster is defined as a parent pattern.

Figure 35:
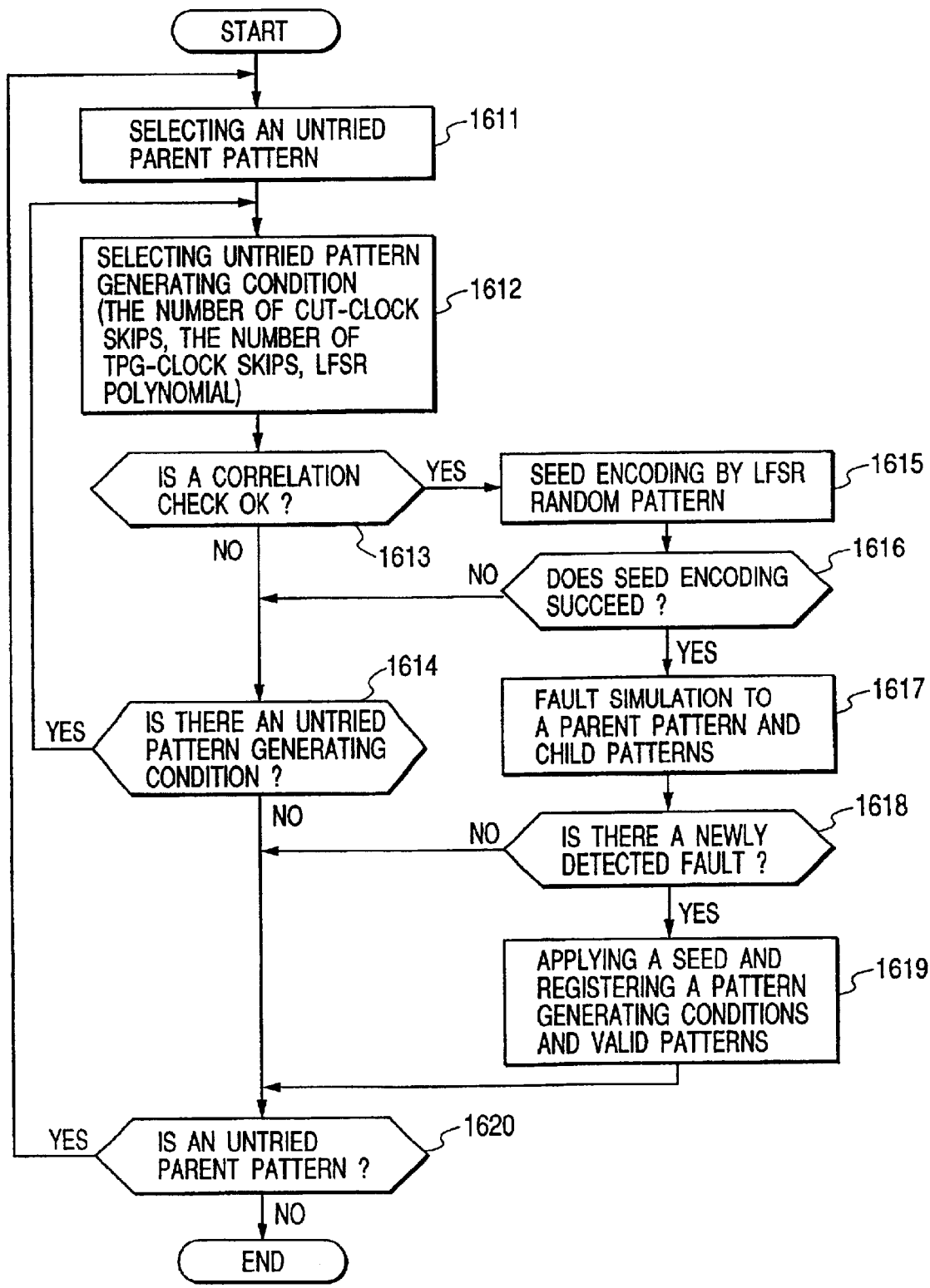
FIG. 35 is a flow chart illustrating the detailed sequence for seed set generation as shown in FIG. 33.

FIG. 35 shows the procedure for seed set generation 1504 in FIG. 33. At step 1811, an untried parent pattern is selected from the parent pattern set 1514; at step 1812, the conditions for untried patterns are selected from pattern generating conditions (the number of CUT-clock skips, the number of TPG-clock skips, the number of additional TPG-clock skips and LFSR polynomial). The following steps are taken for the selected parent pattern and pattern generating conditions. At step 1813, a check is made of the scan chain connection and the correlation among storage elements which depends on, the number of CUT-clock skips, the number of TPG-clock skips and the number of additional TPG-clock skips. In case the pattern is found to be unrealizable, if yes at step 1814, or there is an untried pattern generating condition, the process goes back to step 1812; if no, or there is no untried pattern generating condition, the process goes to step 1820. If yes at step 1813 or there is no problem in the correlation check result, the process goes to step 1815 and LFSR seed is calculated using simultaneous linear equations so that a parent pattern can be realized by random number sequences from the selected LFSR polynomial. If there is no seed which satisfies the condition, the process goes from step 1816 to step 1614. If there exists a seed which satisfies the condition, the process goes to step 1817, in which fault simulation is performed on a parent pattern and child patterns which are generated depending on the functionality of the bit-flipping controller 121. If no new fault is detected at step 1818, the process goes to step 1820. If a new fault is detected, a set of valid child pattern numbers are registered. At step 1819, an LFSR seed, the storage element value which specifies the LFSR feedback position as determined by the selected LFSR polynomial, and the initial value of the pattern generator which depends on the value of the pattern sequence number counter as determined by the first number of valid child patterns are applied, and pattern generating conditions (the number of CUT-clock skips, the number of TPG-clock skips, the number of additional TPG-clock skips, and the number of child patterns as the difference between the first and last valid child pattern numbers plus 1) are registered. At step 1820, if an untried parent pattern is found, the process goes back to step 1811; if it is found that all parents patterns have been tried, the process is ended.

Figure 36:
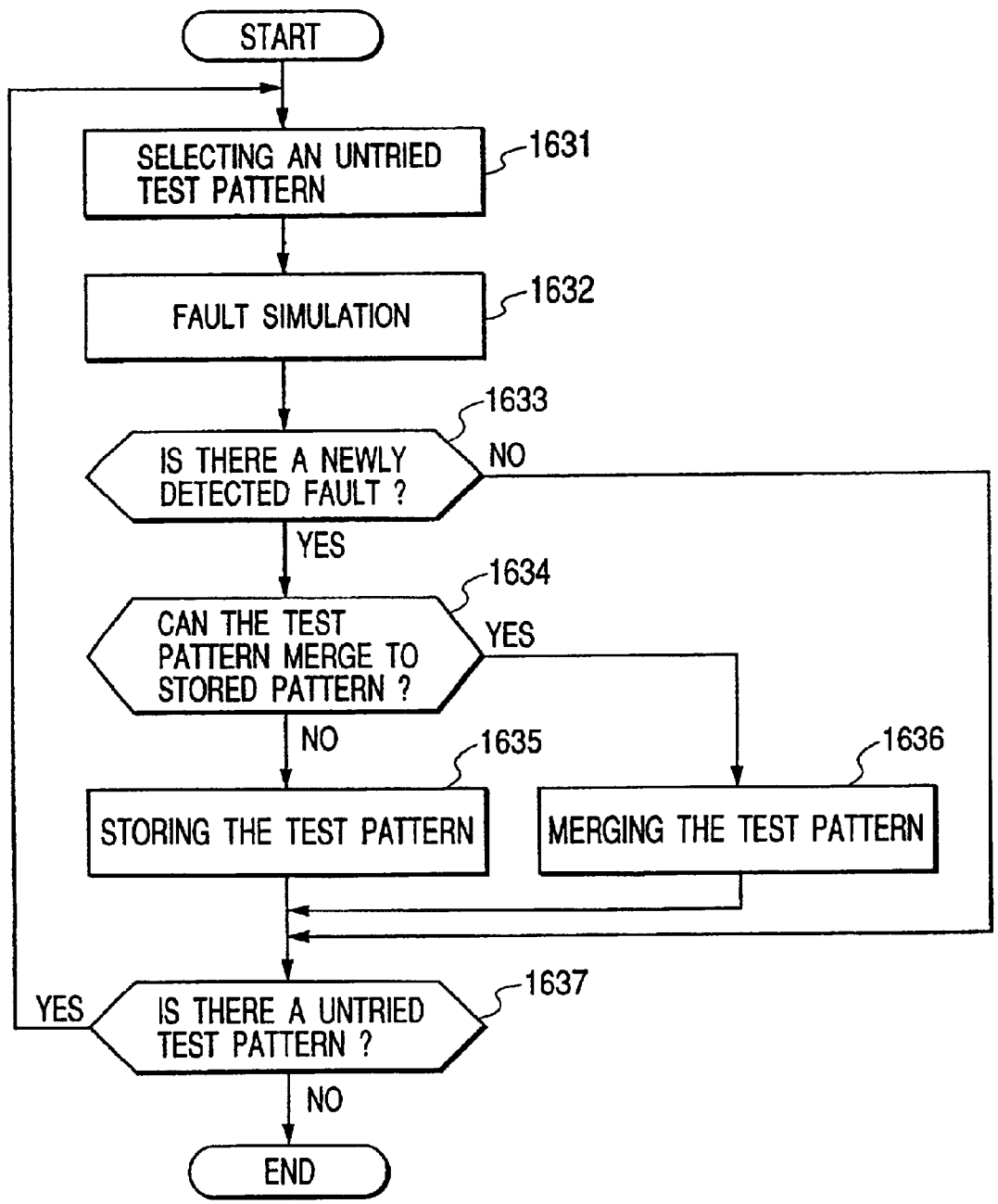
FIG. 36 is a flow chart illustrating the detailed sequence for test pattern generation as shown in FIG. 33.

FIG. 36 shows the procedure for additional test pattern generation 1505 in FIG. 33. At step 1931, an untried test pattern is selected from the test pattern set 1513 and at step 1932, fault simulation is performed on that pattern. At step 1933, if there is a newly detected fault, the process goes to step 1934; if not, it goes to step 1937. If it is found at step 1934 that the test pattern being tried can be merged with a stored pattern, the pattern is merged at step 1936; if not, the pattern is newly stored at step 1935. At step 1937, if an untried test pattern is found, the process goes to step 1931; if it is found that all test patterns in the test pattern set 1513 have been tried, the process is ended.

The process of carrying out steps 1502, 1503 and 1504 on the semiconductor integrated circuit 1200 in FIG. 28 is explained below as an example. The test pattern set 1513 as the result of test pattern generation 1502 refers to test patterns 1242 as shown in FIG. 28(*b*). The step of parent pattern generation 1503 takes place as follows. At step 1701, test pattern numbers 1 to 11 are classified into two groups: a group composed of pattern Nos. 1 to 9 which require signal lines x1, x2, . . . x8 to be set, and a group composed of pattern Nos. 10 and 11 which require signal line y0 to be set. At step 1702, if the predetermined Hamming distance is 1, because the former group (pattern Nos. 1 to 9) is in the neighborhood of pattern No. 1 and the latter group (pattern Nos. 10 and 11) in the neighborhood of pattern No. 10, each group can become a pattern cluster. At step 1703, for the group of pattern Nos. 1 to 9, the parent pattern which is decided by majority of bits coincides with pattern No. 1, and for the group of pattern Nos. 10 and 11, the parent pattern coincides with pattern No. 10.

The next step is seed set generation 1504. At step 1711, pattern No. 1 or the parent pattern is selected and at step 1712, 0 as the number of CUT-clock skips, 0 as the number of TPG-clock skips, and LFSR polynomial x^4+1=0 (operation as a shift register) are selected. At step 1613, a check is made of the correlation among storage elements; in this case, there is no such correlation in the CUT 1220 so the check result is OK (yes). At step 1615, when seed is expressed as (s1, s2, s3, s4), the conditions for storage elements 1228 to 1221 are s1=1, s2=1, s3=1, s4=1, r1=1, r2=1, r3=1, r4=1, r5=1; these simultaneous linear equations are solved. It should be, however, noted that r1, r2, . . . r5 are random number sequences which are generated after initialization of LFSR and the following relations hold: r1=s1, r2=s2, r3=s3, r4=s4, r5=s5. The solutions of the simultaneous linear equations exist as follows: s1=1, s2=1, s3=1, s4=1. In other words, seed encoding is successful so fault simulation is made on the parent pattern and eight child patterns generated from this seed at step 1617. The result is generation of test patterns as shown in FIG. 29 to detect all stuck-at faults. Thus, at step 1619, this seed is applied; information on the seed as (1, 1, 1, 1) and pattern generating conditions (the number of CUT-clock skips=0, the number of TPG-clock skips=0, and LFSR polynomial x^4+1=0) is registered. After that, the process goes back to step 1611, from which steps 1612, 1613, 1615, 1616 and 1617 for the parent pattern, or pattern No. 10, are carried out to extract seed (X, 1, X, X); since at step 1618 it is found that there is no newly detected fault, this seed is not applied.

Figure 37:
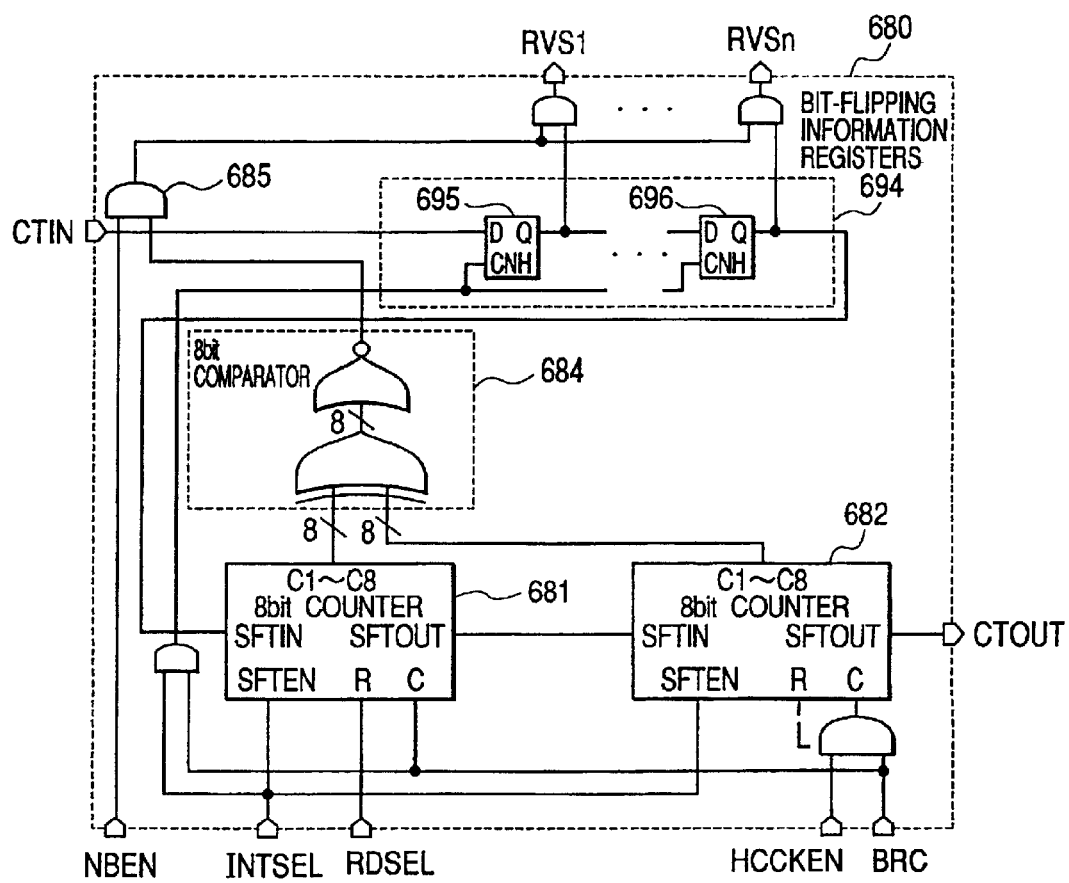
FIG. 37 is another circuit diagram for the bit-flipping controller in an embodiment of a test pattern generator according to this invention.

FIG. 37 illustrates another circuit example for the bit-flipping controller in a test pattern generator according to this invention. The circuit shown in FIG. 11 enables flipping control in even-numbered or odd-numbered rows as shown in FIG. 25. By contrast, the circuit shown in FIG. 37 enables flipping control in any desired row. Regarding the circuit components, the counter 681 for time in pattern sequence, counter 682 for pattern sequence number, comparator 684 and AND element 685 are functionally equivalent to the counter 601 for time in pattern sequence, counter 602 for pattern sequence number, comparator 604 and AND element 605 in FIG. 10; so their descriptions are omitted here. The distinct feature of this circuit is that a bit-flipping information registers 694 is provided in order to control bit-flipping for each row. The bit-flipping information register includes n registers and the logical product of the output of each register and the output of AND element 685 is outputted to output RVS1, RVS2, . . . RVSn.

Figure 38:
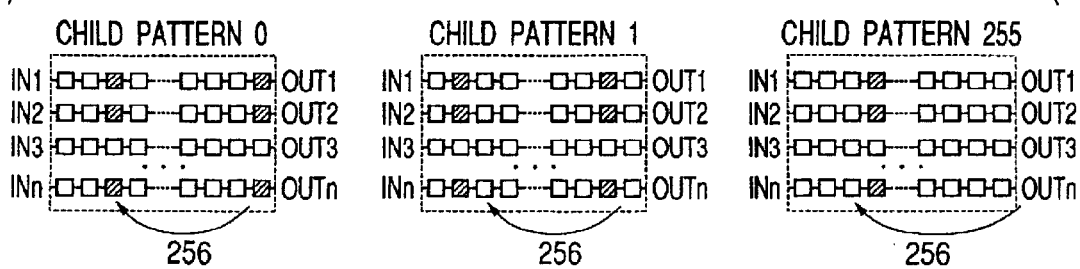
FIG. 38 illustrates child patterns in case of using the bit-flipping controller as shown in FIG. 37.

Patterns for flipping bits in specific rows are inputted through CTIN to the bit-flipping information register 694. FIG. 38 shows child patterns generated in case that (1, 1, 0, . . . 1) is inputted as a pattern for flipping bits in rows to (register 1, register 2, register 3, . . . register n), where register i corresponds to output RVSi. In this case, in a bit-flipping column (e.g. the third column in child pattern 0), the bits in the first, second and n-th rows are flipped with respect to the parent pattern and the bit in the third row is not flipped. Of course, it is also possible to adopt the structure of the circuit shown in FIG. 12 to make variable the bit flipping column cycle or to adopt the structure of the circuit shown in FIG. 13 to include a plurality of bit-flipping columns. In either case, the bit in a predetermined row in a bit-flipping column is not flipped.

The value to be stored in the bit-flipping information register is basically the one stored in its registers but can be varied for each child pattern. If that is the case, it is necessary to add to the bit-flipping information register 694 another circuit for generating a pattern for flipping bits in desired rows. Although, in the circuit shown in FIG. 37, the bit-flipping information register 694 and counters 681 and 682 are connected on a scan chain, it is also allowable to arrange that the initial value for the bit-flipping information register 694 is entered independently of the counters. If so, the value of the bit-flipping information register 694 can be controlled independently of the counters.

As can be understood from the above description, information necessary for the test method for a semiconductor integrated circuit according to this invention, or initial values for test pattern generators can be calculated by following the above procedures.

The invention has been described with reference to the preferred and alternate embodiments. Obviously, modifications and alternations will occur to those of ordinary skill in the art upon reading and understanding the present invention. It is intended that the invention be construed as including all such modification and alternation in so far they come with the scope of the appended claims or the equivalent thereof.

What is claimed is:

1. A test pattern generator for generating, at least once, a pattern sequence cluster composed of a plurality of pattern sequences with a given number of bits and a given number of times, the test pattern generator comprising:
   an identical pattern sequence generator which generates pattern sequences in the pattern sequence cluster which are all identical; and
   a bit-flipping sequence generator which uses the pattern sequence cluster generated by the identical pattern sequence generator as an input and which flips some bits in pattern sequences in the pattern sequence cluster and which changes the positions of bits to be flipped in patterns according to the pattern sequence number and the time in pattern sequence within the pattern sequence cluster.

2. The test pattern generator according to claim 1, the identical pattern sequence generator having a linear feedback shift register and at least one register which holds the register initial value in the linear feedback shift register while the pattern sequence cluster is being generated.

3. The test pattern generator according to claim 1, the bit-flipping sequence generator including a controller which controls bit-flipping so that an input pattern sequence cluster includes such pattern sequences as binary "1s" without flipped bits, binary "1s" with all or some flipped bits in one pattern sequence and binary "1s" with all or some flipped bits in plural consecutive pattern sequences or pattern sequences at regular intervals, the interval being equivalent to a given number of pattern sequences.

4. A semiconductor integrated circuit, comprising:
   a test pattern generator for generating, at least once, a pattern sequence cluster composed of a plurality of pattern sequences with a given number of bits and a given number of times; and
   a circuit to be tested,
   wherein the test pattern generator comprises;
      an identical pattern sequence generator which generates pattern sequences in the pattern sequence cluster which are all identical; and
      a bit-flipping sequence generator which uses the pattern sequence cluster generated by the identical pattern sequence generator as an input and which flips some bits in pattern sequences in the pattern sequence cluster and which changes the positions of bits to be flipped in patterns according to the pattern sequence number and the time in pattern sequence within the pattern sequence cluster, and
   wherein the test pattern generator or the bit-flipping sequence generator is integrated with the circuit to be tested, and input signal lines on a scan chain provided in the circuit to be tested or external input signal lines to the circuit to be tested are connected with output signal lines of the test pattern generator or the bit-flipping sequence generator.

5. A test pattern generator including:
   a plurality of linear feedback shift registers; and
   a circuit for controlling a mode in which the plural linear feedback shift registers each generate pseudo-random pattern sequences, and a mode in which all or some of the linear feedback shift registers work together as one shift register to generate pseudo-random pattern sequences.

6. A semiconductor integrated circuit test method in which test pattern signals are applied to the circuit to be tested which has scan chain input signal lines or external input signal lines and the pattern of response from the circuit under test is compared with the expected pattern, the process of generating the above test pattern signals comprising the steps of:
   generating identical pattern sequences in a cluster of plural pattern sequences with a given number of bits and a given number of times, all of which are identical; and
   flipping some bits in pattern sequences in the pattern sequence cluster composed of identical pattern sequences and changing the positions of bits to be flipped according to the pattern sequence cluster, and pattern sequence number and time in pattern sequence in the pattern sequence cluster.

7. The test method according to claim 6, the process of generating identical pattern sequences comprising:
   a first step of generating a test pattern set for detection of assumed faults;
   a second step of, taking the test pattern set as pattern sequence groups, classifying the pattern sequence groups into clusters in each of which the pattern sequences are identical in the set of combinations of time in pattern sequence and bit position in pattern to be set, and their Hamming distances are all under a predetermined distance; and
   a third step of generating, for each of the pattern sequence clusters, pattern sequences as decided by majority with regard to time in pattern sequence end bit position in pattern from the pattern sequences belonging to it.

8. The test method according to claim 6, the process of generating identical pattern sequences comprising:
   first step of generating a test pattern set for detection of presumed faults;
   a second step of taking the test pattern set as pattern sequence groups, classifying the pattern sequence set into clusters in each of which the pattern sequences are identical in the set of combinations of time in pattern sequence and bit position in pattern to be set and their Hamming distances are all under a predetermined distance;

a third step of generating, for each of the pattern sequence clusters, pattern sequences as decided by majority with regard to time in pattern sequence and bit position in pattern from the pattern sequences belonging to the pattern sequence cluster;

a fourth step of encoding the pattern sequences decided at the third step into LFSR register initial values; and a fifth step of selecting, from the LFSR register initial values obtained at the fourth step, ones which can be used to newly detect faults when developed for a pattern sequence cluster, or ones which include test patterns.

9. A method for generating at least once a pattern sequence cluster composed of a plurality of pattern sequences with a given number of bits and a given number of times, comprising the steps of:

generating a reference pattern sequence as a reference and, flipping some bits in some of the pattern sequences so that the cluster includes, with respect to the reference pattern sequence, pattern sequences without flipped bits, pattern sequences with all or some flipped bits in one pattern and pattern sequences with all or some flipped bits in consecutive patterns or patterns at regular intervals, the interval being equivalent to a given number of patterns.

10. A semiconductor integrated circuit test method, according to claim 9, wherein the generated pattern sequence cluster is composed of a plurality of pattern sequences having the number of bits and the maximum length of a scan chain which depend on the number of scan chains and the number of external input terminals, and further comprising applying the pattern sequence cluster to a circuit under test at least once.

11. The semiconductor integrated circuit test method according to claim 10, the process of generating the reference pattern sequence comprising:

a first step of generating a test pattern set for detection of assumed faults;

a second step of, taking the test pattern set as pattern sequence groups, classifying the pattern sequence set into clusters in each of which the pattern sequences are identical in the set of combinations of time in pattern sequence and bit position in pattern to be set and their Hamming distances are all under a predetermined distance; and a third step of generating, for each of the pattern sequence clusters, a pattern sequence as decided by majority with regard to time in pattern sequence and bit position in pattern from the pattern sequences belonging to the pattern sequence cluster, and defining it as the reference pattern sequence.

12. A semiconductor integrated circuit teat method, comprising the steps of generating test patterns by scan chain shift for a full scan design semiconductor integrated circuit, wherein the scan chain shift is provided without any change in all scan chain inputs to set an identical logical value on neighboring storage elements on a scan chain, and using a resulting patterns, from the scan chain shift as said test patterns.

* * * * *